(12) United States Patent
Kushida et al.

(10) Patent No.: US 11,136,454 B2
(45) Date of Patent: Oct. 5, 2021

(54) THERMOSETTING RESIN COMPOSITION AND ITS PRODUCTION METHOD, PREPREG, LAMINATE, AND PRINTED WIRING BOARD

(71) Applicant: HITACHI CHEMICAL COMPANY, LTD., Tokyo (JP)

(72) Inventors: Keisuke Kushida, Tokyo (JP); Hiroshi Shimizu, Tokyo (JP); Minoru Kakitani, Tokyo (JP); Yoshikatsu Shiraokawa, Tokyo (JP); Tatsunori Kaneko, Tokyo (JP)

(73) Assignee: Showa Denko Materials Co., Ltd., Tokyo (JP)

(*) Notice: Subject to any disclaimer, the term of this patent is extended or adjusted under 35 U.S.C. 154(b) by 0 days.

(21) Appl. No.: 15/538,581

(22) PCT Filed: Dec. 7, 2016

(86) PCT No.: PCT/JP2016/086457
§ 371 (c)(1),
(2) Date: Jun. 21, 2017

(87) PCT Pub. No.: WO2018/105071
PCT Pub. Date: Jun. 14, 2018

(65) Prior Publication Data
US 2020/0002526 A1    Jan. 2, 2020

(51) Int. Cl.
| | |
|---|---|
| C08L 33/24 | (2006.01) |
| C08F 2/44 | (2006.01) |
| C08F 212/08 | (2006.01) |
| C08F 222/06 | (2006.01) |
| C08G 59/42 | (2006.01) |
| C08J 5/24 | (2006.01) |
| C08K 3/36 | (2006.01) |
| C08K 5/00 | (2006.01) |
| C08K 5/3415 | (2006.01) |
| C08K 5/521 | (2006.01) |
| C08K 5/5333 | (2006.01) |
| C08K 9/06 | (2006.01) |
| C08L 63/04 | (2006.01) |

(52) U.S. Cl.
CPC ............ *C08L 33/24* (2013.01); *C08F 2/44* (2013.01); *C08F 212/08* (2013.01); *C08F 222/06* (2013.01); *C08G 59/42* (2013.01); *C08J 5/24* (2013.01); *C08K 3/36* (2013.01); *C08K 5/0066* (2013.01); *C08K 5/3415* (2013.01); *C08K 5/521* (2013.01); *C08K 5/5333* (2013.01); *C08K 9/06* (2013.01); *C08L 63/04* (2013.01); *C08L 2201/02* (2013.01); *C08L 2203/20* (2013.01); *C08L 2205/03* (2013.01)

(58) Field of Classification Search
CPC .... C08L 33/24; C08L 63/00–10; C08L 35/00; C09D 133/24; C09D 163/00–10; C09D 135/00; C09J 133/24; C09J 163/00–10; C09J 135/00; C08J 2333/24; C08J 2433/24; C08J 2363/00–10; C08J 2463/00–10; C08J 2335/00; C08J 2435/00; C08K 5/53–5317
See application file for complete search history.

(56) References Cited

U.S. PATENT DOCUMENTS

| | | | |
|---|---|---|---|
| 3,985,928 A | 10/1976 | Watanabe et al. | |
| 7,273,901 B2 * | 9/2007 | Sicken | C08K 5/17 252/609 |
| 2010/0279129 A1 | 11/2010 | Tsuchikawa et al. | |
| 2015/0351236 A1 * | 12/2015 | Kato | B32B 37/0007 174/258 |

FOREIGN PATENT DOCUMENTS

| | | | |
|---|---|---|---|
| CN | 101215405 A | | 7/2008 |
| CN | 102675598 A | | 9/2012 |
| JP | 50-153098 A | | 12/1975 |
| JP | 56-133355 A | | 10/1981 |
| JP | 58-69046 A | | 4/1983 |
| JP | 58-164638 A | | 9/1983 |
| JP | 61-18937 B2 | | 5/1986 |
| JP | 61-286130 A | | 12/1986 |
| JP | 62-148512 A | | 7/1987 |
| JP | 2-208355 A | | 8/1990 |
| JP | 6-179734 A | | 6/1994 |
| JP | 2006028249 A | * | 2/2006 |
| JP | 2010-053334 A | | 3/2010 |
| JP | 2011-006683 A | | 1/2011 |
| JP | 2012153896 A | | 8/2012 |
| JP | 2012-229363 A | | 11/2012 |
| JP | 2016008229 A | * | 1/2016 |
| JP | 2016017091 A | * | 2/2016 |
| JP | 2016-222837 A | | 12/2016 |
| TW | 200904896 A | | 2/2009 |
| WO | 2009/081601 A1 | | 7/2009 |
| WO | 2016/175326 A1 | | 11/2016 |
| WO | 2016/194927 A1 | | 12/2016 |

OTHER PUBLICATIONS

Partial machine translation of WO 2016/194927 A1.*
Partial machine translation of JP-2016017091-A.*
Cray Valley, SMA EF-80 Technical Data Sheet (2016).*
International Search Report for PCT/JP2016/086457 dated Feb. 21, 2017; English translation submitted herewith (6 pages).

(Continued)

*Primary Examiner* — Kregg T Brooks
(74) *Attorney, Agent, or Firm* — Fitch, Even, Tabin & Flannery, LLP

(57) ABSTRACT

The present invention provides a thermosetting resin composition containing (A) a maleimide compound, (B) an epoxy resin having at least two epoxy groups in one molecule, (C) a copolymer resin having a structural unit derived from an aromatic vinyl compound and a structural unit derived from a maleic anhydride, (D) a silica treated with an aminosilane coupling agent, and (E) a flame retardant dispersion.

15 Claims, No Drawings

(56) References Cited

OTHER PUBLICATIONS

Written Opinion of the International Searching Authority for PCT/JP2016/086456 dated Feb. 21, 2017; English translation submitted herewith (6 pages).

\* cited by examiner

THERMOSETTING RESIN COMPOSITION AND ITS PRODUCTION METHOD, PREPREG, LAMINATE, AND PRINTED WIRING BOARD

CROSS-REFERENCE TO RELATED APPLICATIONS

This application is a U.S. national phase application filed under 35 U.S.C. § 371 of International Application No. PCT/JP2016/086457, filed Dec. 7, 2016 designating the United States, the complete disclosures of which is hereby incorporated herein by reference in its entirety for all purposes.

TECHNICAL FIELD

The present invention relates to a thermosetting resin composition and its production method, and to a prepreg, a laminate and a printed wiring board.

BACKGROUND ART

Recently in mother boards for multifunctional cell-phone units and the like, the ratio of line width (L) to space (S) [L/S] in a wiring board has become narrowed with advanced high-speed communication, wiring densification and ultra-thinning of wiring boards. With such narrowing of L/S, it has become difficult to stably produce wiring boards at high yield. In conventional planning of wiring boards, a layer with no wiring pattern, called a "skip layer" is partly arranged. With increased functionality of electronic devices, the wiring design volume comes to increase and the number of layers in a wiring board thereby increase, but by arranging the above-mentioned skip layer, there occurs a problem in that the thickness of the mother board further increases.

As a method of solving these problems, it is effective to reduce the relative permittivity of the insulating material to be used in the wiring board. Reduction in the relative permittivity of the insulating material facilitates L/S impedance control, therefore enabling stable production of intended wiring boards with currently planned L/S, and accordingly it becomes possible to reduce the number of layers by thinning out skip layers.

Recently with advanced large-scale integration in electronic devices, materials having a low relative permittivity capable of satisfying a demand for device thinning have become desired also for mother boards for much thinned and low-priced cell phones and others, and communication system devices as typified by servers, routers and portable base stations have become used in a higher frequency band region, and under the situation, materials having a low relative permittivity are desired.

A lead-free solder having a high melting point has become used in soldering electronic parts, and consequently materials having a high glass transition temperature (high Tg) and excellent in reflow heat resistance have become desired. Further, with raising of environmental awareness, halogen-free substrates have become used, but halogen-free substrates are inferior to ordinary halogen-containing substrate in point of flame retardancy and therefore those having higher flame retardancy than conventional ones are needed.

In mother boards for use in multifunctional cell-phone units and the like, the layers are desired to be connected through small laser vias, with increase in the wiring density and reduction in the pattern width. From the viewpoint of connection reliability filled plating is employed in many cases, and since the connection in the interface between inner copper and plating copper is extremely important, improving the laser workability of substrates is desired.

After laser working of substrates, in general, a step of removing a residual component of resin (desmearing step) is carried out. Desmearing treatment is carried out on the bottom and the side wall of a laser via, and therefore, in the case where a large amount of the resin component of a substrate dissolves in desmearing treatment, the shape of the laser via would be significantly deformed. In addition, there may occur other various problems of uneven plating owing to variability in irregularities on the side wall. From this, it is desired that the amount of the resin component of a substrate to dissolve in desmearing treatment, that is, the desmearing dissolution amount could be an adequate value.

Heretofore, for preparing a thermosetting resin composition having a small relative permittivity there have been employed a method of blending an epoxy resin having a small relative permittivity a method of introducing a cyanate group, a method of blending a polyphenylene ether, etc. However, merely by combining these methods in a simple manner, it is still difficult to satisfy various requirements of reduced relative permittivity increased heat resistance, reliability and halogen freeness. For example, there have been proposed a resin composition containing an epoxy resin (see PTL 1), a resin composition containing a polyphenylene ether and a bismaleimide (see PTL 2), a resin composition containing a polyphenylene ether and a cyanate resin (see PTL 3), a resin composition containing at least one of a styrenic thermoplastic elastomer or the like, and/or a triallyl cyanurate or the like (see PTL 4), a resin composition containing a polybutadiene (see PTL 5), a resin composition prepared by pre-reacting a polyphenylene ether resin, a polyfunctional maleimide and/or a polyfunctional cyanate resin, and a liquid polybutadiene (see PTL 6), a resin composition containing an unsaturated double bond group-having compound-imparted or grafted polyphenylene ether, and a triallyl cyanurate and/or a triallyl isocyanurate (see PTL 7), a resin composition containing a reaction product of a polyphenylene ether and an unsaturated carboxylic acid or unsaturated acid anhydride, and a polyfunctional maleimide (see PTL 8), etc.

CITATION LIST

Patent Literature

PTL 1: JP-A 58-69046
PTL 2: JP-A 56-133355
PTL 3: JP-B 61-18937
PTL 4: JP-A 61-286130
PTL 5: JP-A62-148512
PTL 6: JP-A 58-164638
PTL 7: JP-A 2-208355
PTL 8: JP-A 6-179734

SUMMARY OF INVENTION

Technical Problem

A prepreg containing a resin composition described in PTLs 1-8 could show a relatively good relative permittivity, but many of them could not satisfy the severe demand in recent markets. In addition, in many cases, any of high heat resistance, high metal foil adhesion, high glass transition temperature, low thermal expansion, moldability and platability (laser workability) is insufficient, and there is still room for further improvement.

Further, while investigating resin compositions capable of satisfying all the above-mentioned requirements, the present inventors have taken particular note of the appearance of the substrate obtained from the resin composition capable of satisfying the requirements, and have newly encountered a problem that there exist plural parts having a relatively high density (hereinafter also referred to as "high-density parts") and having a size of a few m to several tens of m on the surface thereof and the surface of the cured product of the composition is thereby nonhomogeneous. Productivity is worsened by the presence of such high-density parts and improvement thereon is desired.

Consequently an object of the present invention is to provide a thermosetting resin composition having high heat resistance, low relative permittivity, high metal foil adhesion, high glass transition temperature and low thermal expansion, excellent in moldability and platability and capable of giving a cured product whose surface is prevented from having high-density parts, and a method for producing the thermosetting resin composition, and to provide a prepreg, a laminate and a printed wiring board using the thermosetting resin composition.

Solution to Problem

The present inventors have assiduously studied for the purpose of solving the above-mentioned problems and, as a result, have found that, when a thermosetting resin composition containing "(A) a maleimide compound", "(B) an epoxy resin having at least two epoxy groups in one molecule", "(C) a copolymer resin having a specific structural unit", and "(D) a silica treated with an aminosilane coupling agent" contains a flame retardant, the above-mentioned high-density parts form, and that, when the flame retardant is used as "(E) a flame retardant dispersion", the above-mentioned problems can be solved, and have completed the present invention.

Specifically the present invention relates to the following [1] to [15].

[1] A thermosetting resin composition containing:
(A) a maleimide compound,
(B) an epoxy resin having at least two epoxy groups in one molecule,
(C) a copolymer resin having a structural unit derived from an aromatic vinyl compound and a structural unit derived from a maleic anhydride,
(D) a silica treated with an aminosilane coupling agent, and
(E) a flame retardant dispersion.

[2] The thermosetting resin composition according to the above [1], wherein the component (E) is a dispersion of a flame retardant dispersed in an organic solvent, and the content of the organic solvent in the component (E) is from 25 to 55 parts by mass relative to 100 parts by mass of the flame retardant.

[3] The thermosetting resin composition according to the above [1] or [2], wherein the component (E) contains a metal salt of a di-substituted phosphinic acid as a flame retardant.

[4] The thermosetting resin composition according to any of the above [1] to [3], wherein the component (E) contains a ketone solvent as an organic solvent.

[5] The thermosetting resin composition according to any of the above [1] to [4], wherein the component (A) is a maleimide compound having an acidic substituent and an N-substituted maleimide group, which is obtained by reacting (a1) a maleimide compound having at least two N-substituted maleimide groups in one molecule, (a2) a monoamine compound having an acidic substituent, and (a3) a diamine compound.

[6] The thermosetting resin composition according to the above [5], wherein the component (a2) is a monoamine compound having an acidic substituent represented by the following general formula (a2-1), and the component (a3) is a diamine compound represented by the following general formula (a3-1):

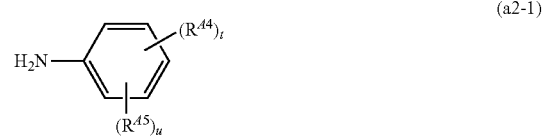

wherein $R^{A4}$ represents an acidic substituent selected from a hydroxy group, a carboxy group and a sulfonic acid group, $R^{A5}$ represents an alkyl group having 1 to 5 carbon atoms, or a halogen atom, t represents an integer of 1 to 5, u represents an integer of 0 to 4, and t and u satisfy $1 \leq t+u \leq 5$, provided that when t is an integer of 2 to 5, plural $R^{A4}$'s may be the same or different, and when u is an integer of 2 to 4, plural $R^{A5}$'s may be the same or different;

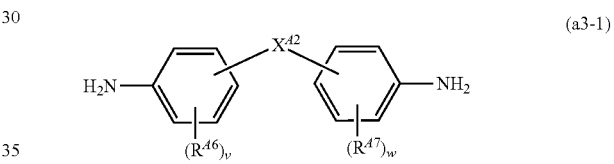

wherein $X^{A2}$ represents an aliphatic hydrocarbon group having 1 to 3 carbon atoms, or —O—, $R^{A6}$ and $R^{A7}$ each independently represent an alkyl group having 1 to 5 carbon atoms, a halogen atom, a hydroxy group, a carboxy group or a sulfonic acid group, and v and w each independently represent an integer of 0 to 4.

[7] The thermosetting resin composition according to any of the above [1] to [6], wherein the component (C) is a copolymer resin having a structural unit represented by the following general formula (C-i) and a structural unit represented by the following formula (C-ii):

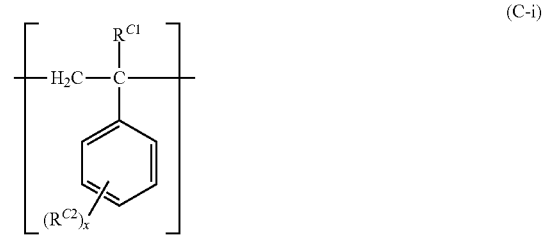

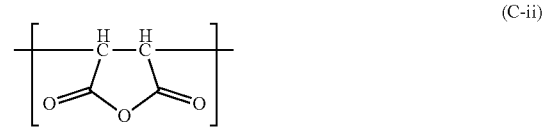

wherein $R^{C1}$ represents a hydrogen atom, or an alkyl group having 1 to 5 carbon atoms, $R^{C2}$ represents an alkyl group having 1 to 5 carbon atoms, an alkenyl group having 2 to 5 carbon atoms, an aryl group having 6 to 20 carbon atoms, a hydroxy group, or a (meth)acryloyl group, and x represents an integer of 0 to 3, provided that when x is 2 or 3, plural $R^{C2}$'s may be the same or different.

[8] The thermosetting resin composition according to any of the above [1] to [7], wherein in the component (C), the content ratio of the structural unit derived from an aromatic vinyl compound to the structural unit derived from a maleic anhydride [aromatic vinyl compound-derived structural unit/maleic anhydride-derived structural unit] (molar ratio) is from 1 to 9.

[9] The thermosetting resin composition according to any of the above [1] to [8], wherein the weight average molecular weight of the component (C) is from 4,500 to 18,000.

[10] The thermosetting resin composition according to any of the above [1] to [9], wherein the component (B) is one or more selected from the group consisting of a bisphenol F-type epoxy resin, a phenol-novolak-type epoxy resin, a cresol-novolak-type epoxy resin, a naphthalene-type epoxy resin, an anthracene-type epoxy resin, a biphenyl-type epoxy resin, a biphenylaralkyl-type epoxy resin, and a dicyclopentadiene-type epoxy resin.

[11] The thermosetting resin composition according to any of the above [1] to [10], further containing (F) a curing agent.

[12] A prepreg containing a thermosetting resin composition of any of the above [1] to [11].

[13] A laminate containing a prepreg of the above [12] and a metal foil.

[14] A printed wiring board containing a prepreg of the above [12] or a laminate of the above [13].

[15] A method for producing a thermosetting resin composition of any of the above [1] to [11], which includes the following steps 1 and 2:
  step 1: a step of dispersing a flame retardant in a dispersion medium to prepare (E) a flame retardant dispersion; and
  step 2: a step of mixing (A) a maleimide compound, (B) an epoxy resin having at least two epoxy groups in one molecule, (C) a copolymer resin having a structural unit derived from an aromatic vinyl compound and a structural unit derived from a maleic anhydride, (D) a silica treated with an aminosilane coupling agent, and (E) the flame retardant dispersion prepared in the step 1.

Advantageous Effects of Invention

According to the present invention, there can be provided a thermosetting resin composition having high heat resistance, low relative permittivity, high metal foil adhesion, high glass transition temperature and low thermal expansion, excellent in moldability and platability and capable of giving a cured product whose surface is prevented from having high-density parts, and a method for producing the thermosetting resin composition, as well as a prepreg, a laminate and a printed wiring board using the thermosetting resin composition.

DESCRIPTION OF EMBODIMENTS

[Thermosetting Resin Composition]

The thermosetting resin composition of the present invention is a thermosetting resin composition containing:
  (A) a maleimide compound (hereinafter also referred to as "component (A)"),
  (B) an epoxy resin having at least two epoxy groups in one molecule (hereinafter also referred to as "epoxy resin (B)" or component (B)"),
  (C) a copolymer resin having a structural unit derived from an aromatic vinyl compound and a structural unit derived from a maleic anhydride (hereinafter also referred to as "copolymer resin (C)" or "component (C)"),
  (D) a silica treated with an aminosilane coupling agent (hereinafter also referred to as "component (D)"), and
  (E) a flame retardant dispersion (hereinafter also referred to as "component (E)").

The components that the thermosetting resin composition contains are described in detail hereinunder.

<(A) Maleimide Compound>

The maleimide compound (A) is not specifically limited so far as it is a compound having a maleimide group, but is preferably a maleimide compound having an N-substituted maleimide group, and more preferably a maleimide compound having an acidic substituent and an N-substituted maleimide group, which is obtained by reacting (a1) a maleimide compound having at least two N-substituted maleimide groups in one molecule (hereinafter also referred to as "maleimide compound (a1)" or "component (a1)"), (a2) a monoamine compound having an acidic substituent (hereinafter also referred to as "monoamine compound (a2)" or "component (a2)"), and (a3) a diamine compound (hereinafter also referred to as "component (a3)"). In the following, the description relating to the component (A) may be read as a description of the maleimide compound having an acidic substituent and an N-substituted maleimide compound.

The weight average molecular weight (Mw) of the component (A) is, from the viewpoint of solubility in organic solvent and from the viewpoint of mechanical strength, preferably 400 to 3,500, more preferably 600 to 2,300, even more preferably 800 to 2,000. The weight average molecular weight in this description is a value measured according to a gel permeation chromatography (GPC) method (standard polystyrene-equivalent conversion value) using tetrahydrofuran as an eluent, and is more specifically a value measured according to the method described in the section of Examples.

((a1) Maleimide Compound)

The maleimide compound (a1) is a maleimide compound having at least two N-substituted maleimide groups in one molecule.

The maleimide compound (a1) includes a maleimide compound having an aliphatic hydrocarbon group between arbitrary two maleimide groups among plural maleimide groups therein (hereinafter also referred to as "aliphatic hydrocarbon group-containing maleimide"), a maleimide compound having an aromatic hydrocarbon group between arbitrary two maleimide groups among plural maleimide groups therein (hereinafter also referred to as "aromatic hydrocarbon group-containing maleimide"), etc. Among these, an aromatic hydrocarbon group-having maleimide is preferred from the viewpoint of high heat resistance, low relative permittivity, high metal foil adhesion, high glass transition temperature, low thermal expansion, moldability and platability.

The maleimide compound (a1) is, from the viewpoint of high heat resistance, low relative permittivity, high metal foil adhesion, high glass transition temperature, low thermal expansion, moldability and platability, preferably a maleimide compound having 2 to 5 N-substituted maleimide groups in one molecule, more preferably a maleimide compound having two N-substituted maleimide groups in one molecule. Also the maleimide compound (a1) is, from the viewpoint of high heat resistance, low relative permittivity, high metal foil adhesion, high glass transition temperature, low thermal expansion, moldability and platability, preferably an aromatic hydrocarbon group-containing maleimide represented by any of the following general formulae (a1-1) to (a1-4), more preferably an aromatic hydrocarbon group-containing maleimide represented by the following general formula (a1-1), (a1-2) or (a1-4), even more preferably an aromatic hydrocarbon group-containing maleimide represented by the following general formula (a1-2).

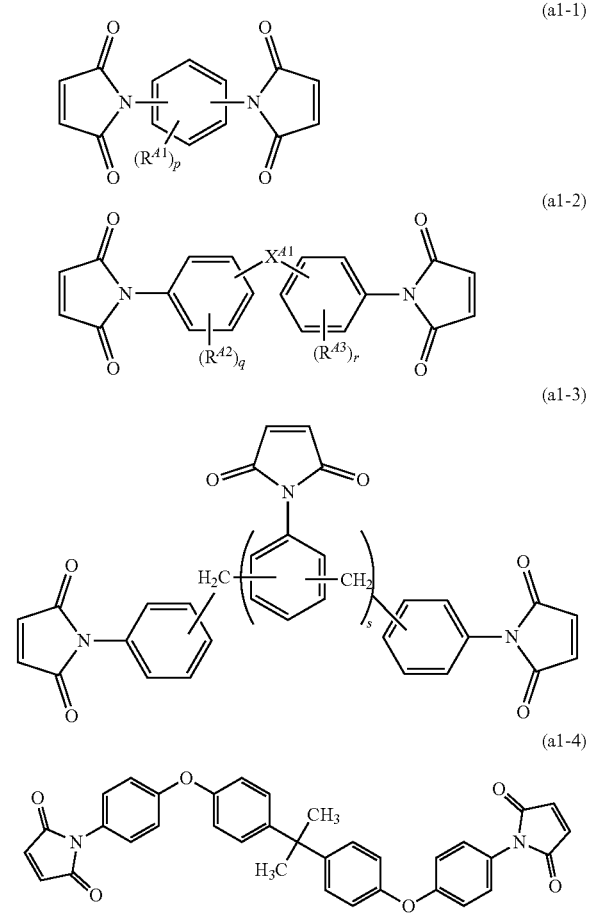

In the above formulae, $R^{41}$ to $R^{43}$ each independently represent an aliphatic hydrocarbon group having 1 to 5 carbon atoms. $X^{41}$ represents an alkylene group having 1 to 5 carbon atoms, an alkylidene group having 2 to 5 carbon atoms, —O—, —C(=O)—, —S—, —S—S— or a sulfonyl group. p, q and r each independently represent an integer of 0 to 4. s represents an integer of 0 to 10.

Examples of the aliphatic hydrocarbon group having 1 to 5 carbon atoms, as represented by $R^{41}$ to $R^{43}$, include a methyl group, an ethyl group, an n-propyl group, an isopropyl group, an n-butyl group, an isobutyl group, a t-butyl group, an n-pentyl group, etc. The aliphatic hydrocarbon group is, from the viewpoint of high heat resistance, low relative permittivity, high metal foil adhesion, high glass transition temperature, low thermal expansion, moldability and platability, preferably an aliphatic hydrocarbon group having 1 to 3 carbon atoms, more preferably a methyl group or an ethyl group.

Examples of the alkylene group having 1 to 5 carbon atoms, as represented by $X^{41}$, include a methylene group, a 1,2-dimethylene group, a 1,3-trimethylene group, a 1,4-tetramethylene group, a 1,5-pentamethylene group, etc. The alkylene group is, from the viewpoint of high heat resistance, low relative permittivity high metal foil adhesion, high glass transition temperature, low thermal expansion, moldability and platability preferably an alkylene group having 1 to 3 carbon atoms, more preferably a methylene group.

Examples of the alkylidene group having 2 to 5 carbon atoms, as represented by $X^{41}$, include an ethylidene group, a propylidene group, an isopropylidene group, a butylidene group, an isobutylidene group, a pentylidene group, an isopentylidene group, etc. Among these, from the viewpoint of high heat resistance, low relative permittivity high metal foil adhesion, high glass transition temperature, low thermal expansion, moldability and platability an isopropylidene group is preferred.

Among the above-mentioned choices, $X^{41}$ is preferably an alkylene group having 1 to 5 carbon atoms or an alkylidene group having 2 to 5 carbon atoms. More preferred ones are as mentioned above.

p, q and r each independently represent an integer of 0 to 4, and from the viewpoint of high heat resistance, low relative permittivity high metal foil adhesion, high glass transition temperature, low thermal expansion, moldability and platability preferably an integer of 0 to 2, more preferably 0 or 1, even more preferably 0.

s represents an integer of 0 to 10, and from the viewpoint of easy availability preferably an integer of 0 to 5, more preferably an integer of 0 to 3. In particular, the aromatic hydrocarbon group-containing maleimide compound represented by the general formula (a1-3) is preferably a mixture where s is an integer of 0 to 3.

Specifically examples of the maleimide compound (a1) include an aliphatic hydrocarbon group-containing maleimide such as N,N'-ethylenebismaleimide, N,N'-hexamethylenebismaleimide, bis(4-maleimidecyclohexyl)methane, 1,4-bis(maleimidemethyl)cyclohexane, etc.; and an aromatic hydrocarbon group-containing maleimide such as N,N'-(1,3-phenylene)bismaleimide, N,N'-[1,3-(2-methylphenylene)]bismaleimide, N,N'-[1,3-(4-methylphenylene)]bismaleimide, N,N'-(1,4-phenylene)bismaleimide, bis(4-maleimidephenyl)methane, bis(3-methyl-4-maleimidephenyl)methane, 3,3'-dimethyl-5,5'-diethyl-4,4'-diphenylmethanebismaleimide, bis(4-maleimidephenyl) ether, bis(4-maleimidephenyl) sulfone, bis(4-maleimidephenyl) sulfide, bis(4-maleimidephenyl) ketone, 1,4-bis(4-maleimidephenyl) cyclohexane, 1,4-bis(maleimidemethyl)cyclohexane, 1,3-bis(4-maleimidephenoxy)benzene, 1,3-bis(3-maleimidephenoxy)benzene, bis[4-(3-maleimidephenoxy)phenyl]methane, bis[4-(4-maleimidephenoxy)phenyl]methane, 1,1-bis[4-(3-maleimidephenoxy)phenyl]ethane, 1,1-bis[4-(4-maleimidephenoxy)phenyl]ethane, 1,2-bis[4-(3-maleimidephenoxy)phenyl]ethane, 1,2-bis[4-(4-maleimidephenoxy)phenyl]ethane, 2,2-bis[4-(3-maleimidephenoxy)phenyl]propane, 2,2-bis[4-(4-maleimidephenoxy)phenyl]propane, 2,2-bis[4-(3-maleimidephenoxy)phenyl]butane, 2,2-bis[4-(4-maleimidephenoxy)phenyl]butane, 2,2-bis[4-(3-maleimidephenoxy)phenyl]-1,1,1,3,3,3-hexafluoropropane, 2,2-bis[4-(4-maleimidephenoxy)phenyl]-1,1,1,3,3,3-hexafluoropropane, 4,4-bis(3-maleimidephenoxy)biphenyl, 4,4-bis(4-maleimidephenoxy)biphenyl, bis[4-(3-maleimidephenoxy)phenyl] ketone, bis[4-(4-maleimidephenoxy)phenyl] ketone, 2,2'-bis(4-maleimidephenyl) disulfide, bis(4-maleimidephenyl) disulfide, bis[4-(3-maleimidephenoxy)

phenyl] sulfide, bis[4-(4-maleimidephenoxy)phenyl] sulfide, bis[4-(3-maleimidephenoxy)phenyl] sulfoxide, bis[4-(4-maleimidephenoxy)phenyl]sulfoxide, bis[4-(3-maleimidephenoxy)phenyl] sulfone, bis[4-(4-maleimidephenoxy)phenyl] sulfone, bis[4-(3-maleimidephenoxy)phenyl] ether, bis[4-(4-maleimidephenoxy)phenyl] ether, 1,4-bis[4-(4-maleimidephenoxy)-α,α-dimethylbenzyl]benzene, 1,3-bis[4-(4-maleimidephenoxy)-α,α-dimethylbenzyl]benzene, 1,4-bis[4-(3-maleimidephenoxy)-α,α-dimethylbenzyl]benzene, 1,3-bis[4-(3maleimidephenoxy)-α,α-dimethylbenzyl]benzene, 1,4-bis[4-(4-maleimidephenoxy)-3,5-dimethyl-α,α-dimethylbenzyl]benzene, 1,3-bis[4-(4-maleimidephenoxy)-3,5-dimethyl-α,α-dimethylbenzyl]benzene, 1,4-bis[4-(3-maleimidephenoxy)-3,5-dimethyl-α,α-dimethylbenzyl]benzene, 1,3-bis[4-(3-maleimidephenoxy)-3,5-dimethyl-α,α-dimethylbenzyl]benzene, polyphenylmethanemaleimide, etc.

Among these, from the viewpoint of high reactivity and advanced heat resistance, bis(4-maleimidephenyl)methane, bis(4-maleimidephenyl) sulfone, bis(4-maleimidephenyl) sulfide, bis(4-maleimidephenyl) disulfide, N,N'-(1,3-phenylene)bismaleimide and 2,2-bis[4-(4-maleimidephenoxy) phenyl]propane are preferred, from the viewpoint of inexpensiveness, bis(4-maleimidephenyl)methane and N,N'-(1, 3-phenylene)bismaleimide are preferred, and from the viewpoint of solubility in solvent, bis(4-maleimidephenyl) methane is especially preferred.

One of the maleimide compounds (a1) may be used singly or two or more kinds thereof may be used in combination.
((a2) Monoamine Compound)

The monoamine compound (a2) is a monoamine compound having an acidic substituent, preferably an aromatic monoamine compound having an acidic substituent, more preferably a monoamine compound represented by the following general formula (a2-1).

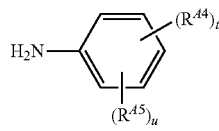

(a2-1)

In the general formula (a2-1), $R^{44}$ represents an acidic substituent selected from a hydroxy group, a carboxy group and a sulfonic acid group, $R^{45}$ represents an alkyl group having 1 to 5 carbon atoms, or a halogen atom, t represents an integer of 1 to 5, u represents an integer of 0 to 4 and satisfies 1≤t+u≤5, provided that when t is an integer of 2 to 5, plural $R^{44}$'s may be the same or different, and when u is an integer of 2 to 4, plural $R^{45}$'s may be the same or different.

The acidic substituent represented by $R^{44}$ is, from the viewpoint of solubility and reactivity preferably a hydroxy group or a carboxy group, and is, also in consideration of heat resistance, more preferably a hydroxy group.

t represents an integer of 1 to 5, and is, from the viewpoint of high heat resistance, low relative permittivity, high metal foil adhesion, high glass transition temperature, low thermal expansion, moldability and platability, preferably an integer of 1 to 3, more preferably 1 or 2, even more preferably 1.

Examples of the alkyl group having 1 to 5 carbon atoms, as represented by $R^{45}$, include a methyl group, an ethyl group, an n-propyl group, an isopropyl group, an n-butyl group, an isobutyl group, a t-butyl group, an n-pentyl group, etc. The alkyl group is preferably an alkyl group having 1 to 3 carbon atoms.

The halogen atom represented by $R^{45}$ includes a fluorine atom, a chlorine atom, a bromine atom, an iodine atom, etc.

u represents an integer of 0 to 4, and is, from the viewpoint of high heat resistance, low relative permittivity, high metal foil adhesion, high glass transition temperature, low thermal expansion, moldability and platability, preferably an integer of 0 to 3, more preferably an integer of 0 to 2, even more preferably 0 or 1, especially preferably 0.

The monoamine compound (a2) is, from the viewpoint of high heat resistance, low relative permittivity, high metal foil adhesion, high glass transition temperature, low thermal expansion, moldability and platability, more preferably a monoamine compound represented by the following general formula (a2-2) or (a2-3), even more preferably a monoamine compound represented by the following general formula (a2-2). $R^{44}$, $R^{45}$ and u in the general formulae (a2-2) and (a2-3) are the same as those in the general formula (a2-1), and preferred examples thereof are also the same as the latter.

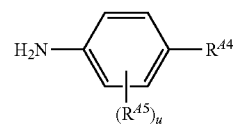

(a2-2)

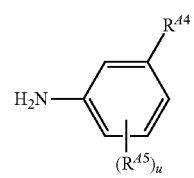

(a2-3)

Examples of the monoamine compound (a2) include o-aminophenol, m-aminophenol, p-aminophenol, o-aminobenzoic acid, m-aminobenzoic acid, p-aminobenzoic acid, o-aminobenzenesulfonic acid, m-aminobenzenesulfonic acid, p-aminobenzenesulfonic acid, 3,5-dihydroxyaniline, 3,5-dicarboxyaniline, etc.

Among these, from the viewpoint of solubility and reactivity m-aminophenol, p-aminophenol, p-aminobenzoic acid and 3,5-dihydroxyaniline are preferred, and from the viewpoint of heat resistance, o-aminophenol, m-aminophenol and p-aminophenol are preferred, and also in consideration of dielectric characteristics, low thermal expansion and production cost, p-aminophenol is more preferred.

One of the monoamine compounds (a2) may be used singly or two or more thereof may be used in combination.
((a3) Diamine Compounds)

The diamine compound (a3) is a compound having two amino groups in one molecule, and is preferably a compound having two primary amino groups in one molecule, more preferably an aromatic diamine compound having two primary amino groups in one molecule, even more preferably a diamine compound represented by the following general formula (a3-1).

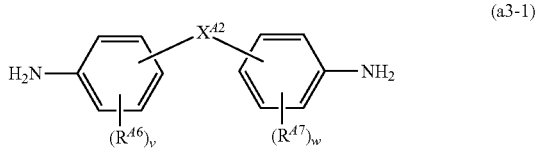

(a3-1)

In the formula, $X^{A2}$ represents an aliphatic hydrocarbon group having 1 to 3 carbon atoms, or —O—, $R^{A6}$ and $R^{A7}$ each independently represent an alkyl group having 1 to 5 carbon atoms, a halogen atom, a hydroxy group, a carboxy group or a sulfonic acid group, v and w each independently represent an integer of 0 to 4.

Examples of the aliphatic hydrocarbon group having 1 to 3 carbon atoms, as represented by $X^{A2}$, include a methylene group, an ethylene group, a propylene group, a propylidene group, etc.

$X^{A2}$ is preferably a methylene group.

Examples of the alkyl group having 1 to 5 carbon atoms, as represented by $R^{A6}$ and $R^{A7}$, include a methyl group, an ethyl group, an n-propyl group, an isopropyl group, an n-butyl group, an isobutyl group, a t-butyl group, an n-pentyl group, etc. The alkyl group is preferably an alkyl group having 1 to 3 carbon atoms.

v and w each are preferably an integer of 0 to 2, more preferably 0 or 1, even more preferably 0.

Specifically examples of the diamine compound (a3) include 4,4'-diaminodiphenylmethane, 4,4'-diaminodiphenylethane, 4,4'-diaminodiphenylpropane, 2,2'-bis[4,4'-diaminodiphenyl]propane, 3,3'-dimethyl-4,4,'-diaminodiphenylmethane, 3,3'-diethyl-4,4'-diaminodiphenylmethane, 3,3'-dimethyl-4,4'-diaminodiphenylethane, 3,3'-diethyl-4,4'-diaminodiphenylethane, 4,4'-diaminodiphenyl ether, 4,4'-diaminodiphenyl thioether, 3,3'-dihydroxy-4,4'-diaminodiphenylmethane, 2,2',6,6'-tetramethyl-4,4'-diaminodiphenylmethane, 3,3'-dichloro-4,4'-diaminodiphenylmethane, 3,3'-dibromo-4,4'-diaminodiphenylmethane, 2,2',6,6'-tetramethylchloro-4,4'-diaminodiphenylmethane, 2,2',6,6'-tetrabromo-4,4'-diaminodiphenylmethane, etc. Among these, from the viewpoint of inexpensiveness, 4,4'-diaminodiphenylmethane and 3,3'-diethyl-4,4'-diaminodiphenylmethane are preferred, and from the viewpoint of solubility in solvent, 4,4'-diaminodiphenylmethane is more preferred.

Preferably the component (a1), the component (a2) and the component (a3) are reacted, for example, in the presence of an organic solvent at a reaction temperature of 70 to 200° C. for 0.1 to 10 hours.

The reaction temperature is more preferably 70 to 160° C., even more preferably 70 to 130° C., especially preferably 80 to 120° C.

The reaction time is more preferably 1 to 6 hours, even more preferably 1 to 4 hours.

(Amount Used of Component (a1), Component (a2) and Component (a3))

In the reaction of the component (a1), the component (a2) and the component (a3), the amount of the three to be used preferably satisfies the following expression that indicates the relationship between the sum total of the equivalent amount of the primary amino group that the component (a2) and the component (a3) have [expressed as —NH$_2$ group equivalent] and the maleimide group equivalent of the component (a1).

0.1≤[maleimide group equivalent]/[sum total of —NH$_2$ group equivalent]≤10

By defining [maleimide group equivalent]/[sum total of —NH$_2$ group equivalent] to be 0.1 or more, gelation and heat resistance reduction could be prevented, and by defining the ratio to be 10 or less, reduction in solubility in organic solvent, metal foil adhesion and heat resistance could be prevented.

From the same viewpoints, more preferably the ratio satisfies:

1≤[maleimide group equivalent]/[sum total of —NH$_2$ group equivalent]≤9, even more preferably 2≤[maleimide group equivalent]/[sum total of —NH$_2$ group equivalent]≤8.

(Organic Solvent)

As described above, preferably the component (a1), the component (a2) and the component (a3) are reacted preferably in an organic solvent.

The organic solvent is not specifically limited so far as it does not have any negative influence on the reaction, and examples thereof include alcohol solvents such as ethanol, propanol, butanol, methyl cellosolve, butyl cellosolve, propylene glycol monomethyl ether, etc.; ketone solvents such as acetone, methyl ethyl ketone, methyl isobutyl ketone, cyclohexanone, etc.; ether solvents such as tetrahydrofuran, etc.; aromatic solvents such as toluene, xylene, mesitylene, etc.; nitrogen atom-containing solvents including amide solvents such as dimethylformamide, dimethylacetamide, N-methylpyrrolidone, etc.; sulfur atom-containing solvents including sulfoxide solvents such as dimethyl sulfoxide, etc.; ester solvents such as ethyl acetate, γ-butyrolactone, etc. Among these, from the viewpoint of solubility alcohol solvents, ketone solvents and ester solvents are preferred, and from the viewpoint of low toxicity cyclohexanone, propylene glycol monomethyl ether, methyl cellosolve, and γ-butyrolactone are more preferred, and also in consideration of the fact that the solvent is highly volatile and could hardly remain as a residual solvent in prepreg production, cyclohexanone, propylene glycol monomethyl ether and dimethylacetamide are more preferred, and dimethylacetamide is especially preferred.

One of the organic solvents may be used singly or two or more thereof may be used in combination.

The amount of the organic solvent to be used is not specifically limited, but from the viewpoint of solubility and reaction efficiency the amount is preferably 25 to 1,000 parts by mass relative to 100 parts by mass of the total of the component (a1), the component (a2) and the component (a3), more preferably 40 to 700 parts by mass, and further preferably 60 to 250 parts by mass. By limiting the amount of the organic solvent used to 25 parts by mass or more, solubility can be readily secured, and by limiting to 1,000 parts by mass or less, significant reduction in reaction efficiency is easy to prevent.

(Reaction Catalyst)

The component (a1), the component (a2) and the component (a3) can be reacted optionally in the presence of a reaction catalyst. Examples of the reaction catalyst include amine catalysts such as triethylamine, pyridine, tributylamine, etc.; imidazole catalysts such as methylimidazole, phenylimidazole, etc.; phosphorus-containing catalysts such as triphenyl phosphine, etc.

One of the reaction catalysts may be used singly or two or more thereof may be used in combination.

The amount of the reaction catalyst to be used is not specifically limited, but is preferably 0.001 to 5 parts by mass relative to 100 parts by mass of the sum total by mass of the component (a1) and the component (a2).

<(B) Epoxy Resin Having at Least Two Epoxy Groups in One Molecule>

Examples of the epoxy resin (B) include glycidyl ether-type epoxy resins, glycidylamine-type epoxy resins, glycidyl ester-type epoxy resins. Among these, glycidyl ether-type epoxy resins are preferred.

The epoxy resin (B) can be classified into various kinds of epoxy resins depending on the difference in the main skeleton. The epoxy resins of the above-mentioned types can be further grouped into bisphenol-type epoxy resins such as bisphenol A-type epoxy resins, bisphenol F-type epoxy resins, bisphenol S-type epoxy resins, etc.; biphenylaralkylphenol-type epoxy resins; novolak-type epoxy resins such as phenol-novolak-type epoxy resins, alkylphenol-novolak-type epoxy resins, cresol-novolak-type epoxy resins, naphtholalkylphenol-copolymerized novolak-type epoxy resins, naphtholaralkylcresol-copolymerized novolak-type epoxy resins, bisphenol A-novolak-type epoxy resins, bisphenol F-novolak-type epoxy resins, etc.; stilbene-type epoxy resins; triazine skeleton-containing epoxy resins; fluorene skeleton-containing epoxy resins; naphthalene-type epoxy resins; anthracene-type epoxy resins; triphenylmethane-type epoxy resins; biphenyl-type epoxy resins; biphenylaralkyl-type epoxy resins; xylylene-type epoxy resins; alicyclic epoxy resins such as dicyclopentadiene-type epoxy resins, etc.

Among these, from the viewpoint of high heat resistance, low relative permittivity, high metal foil adhesion, high glass transition temperature, low thermal expansion, moldability and platability, bisphenol F-type epoxy resins, phenol-novolak-type epoxy resins, cresol-novolak-type epoxy resins, naphthalene-type epoxy resins, anthracene-type epoxy resins, biphenyl-type epoxy resins, biphenylaralkyl-type epoxy resins and dicyclopentadiene-type epoxy resins are preferred, and from the viewpoint of low thermal expansion and high glass transition temperature, cresol-novolak-type epoxy resins, naphthalene-type epoxy resins, anthracene-type epoxy resins, biphenyl-type epoxy resins, biphenylaralkyl-type epoxy resins, and phenol-novolak-type epoxy resins are more preferred, and cresol-novolak-type epoxy resins are even more preferred.

One of the epoxy resins (B) may be used singly or two or more thereof may be used in combination.

The epoxy equivalent of the epoxy resin (B) is preferably 100 to 500 g/eq, more preferably 120 to 400 g/eq, even more preferably 140 to 300 g/eq, especially preferably 170 to 240 g/eq.

Here, the epoxy equivalent is a mass of resin per epoxy group (g/eq), and can be measured according to the method defined in JIS K 7236 (2001). Specifically using an automatic titrator manufactured by Mitsubishi Chemical Analytech Co., Ltd. "GT-200 Model", 2 g of an epoxy resin is metered in a 200-ml beaker, 90 ml of methyl ethyl ketone is dropwise added thereto to dissolve the epoxy resin therein with an ultrasonic washer, and 10 ml of glacial acetic acid and 1.5 g of cetyltrimethylammonium bromide are added, and the resultant solution is titrated with a solution of 0.1 mol/L perchloric acid/acetic acid to thereby determine the epoxy equivalent of the resin.

Commercial products of the epoxy resin (B) include a cresol-novolak-type epoxy resin "EPICLON (registered trademark) N-673" (manufactured by DIC Corporation, epoxy equivalent: 205 to 215 g/eq), a naphthalene-type epoxy resin "HP-4032" (manufactured by Mitsubishi Chemical Corporation, epoxy equivalent: 152 g/eq), a biphenyl-type epoxy resin "YX-4000" (manufactured by Mitsubishi Chemical Corporation, epoxy equivalent: 186 g/eq), a dicyclopentadiene-type epoxy resin "HP-7200H" (manufactured by DIC Corporation, epoxy equivalent: 280 g/eq), etc. The epoxy equivalent is a value described in the catalogue of the product distributed by the manufacturer.

<(C) Copolymer Resin Having Structural Unit Derived from Aromatic Vinyl Compound and Structural Unit Derived from Maleic Anhydride>

The copolymer resin (C) is a copolymer resin having a structural unit derived from an aromatic vinyl compound and a structural unit derived from a maleic anhydride. Examples of the aromatic vinyl compound include styrene, 1-methylstyrene, vinyltoluene, dimethylstyrene, etc. Among these, styrene is preferred.

The copolymer resin (C) is preferably a copolymer resin having a structural unit represented by the following general formula (C-i) and a structural unit represented by the following formula (C-ii).

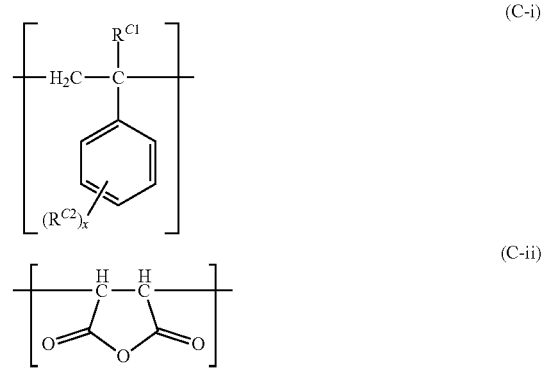

In the formulae, $R^{C1}$ represents a hydrogen atom, or an alkyl group having 1 to 5 carbon atoms, $R^{C2}$ represents an alkyl group having 1 to 5 carbon atoms, an alkenyl group having 2 to 5 carbon atoms, an aryl group having 6 to 20 carbon atoms, a hydroxy group, or a (meth)acryloyl group, x represents an integer of 0 to 3, provided that when x is 2 or 3, plural $R^{C2}$'s may be the same or different.

Examples of the alkyl group having 1 to 5 carbon atoms, as represented by $R^{C1}$ and $R^{C2}$ include a methyl group, an ethyl group, an n-propyl group, an isopropyl group, an n-butyl group, an isobutyl group, a t-butyl group, an n-pentyl group, etc. The alkyl group is preferably an alkyl group having 1 to 3 carbon atoms.

Examples of the alkenyl group having 2 to 5 carbon atoms, as represented by $R^{C2}$ include an allyl group, a crotyl group, etc. The alkenyl group is preferably an alkenyl group having 3 to 5 carbon atoms, more preferably an alkenyl group having 3 or 4 carbon atoms.

The aryl group having 6 to 20 carbon atoms, as represented by $R^{C2}$ include a phenyl group, a naphthyl group, an anthryl group, a biphenylyl group, etc. The aryl group is preferably an aryl group having 6 to 12 carbon atoms, more preferably an aryl group having 6 to 10 carbon atoms.

x is preferably 0 or 1, more preferably 0.

The structural unit represented by the general formula (C-i) is preferably a structural unit represented by the following general formula (C-i-1) where $R^{C1}$ is a hydrogen atom and x is 0, that is, a structural unit derived from styrene.

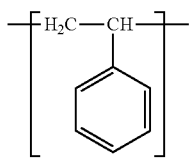

(C-i-1)

The content ratio of the structural unit derived from an aromatic vinyl compound to the structural unit derived from a maleic anhydride [aromatic vinyl compound-derived structural unit/maleic anhydride-derived structural unit] (molar ratio) in the copolymer resin (C) is preferably 1 to 9, more preferably 2 to 9, even more preferably 3 to 8, especially preferably 3 to 7. Similarly the content ratio of the structural unit represented by the formula (C-i) to the structural unit represented by the formula (C-ii) [(C-i)/(C-ii)] (molar ratio) is preferably 1 to 9, more preferably 2 to 9, even more preferably 3 to 8, especially preferably 3 to 7. When the molar ratio is 1 or more, the effect of improving dielectric characteristics tends to be sufficient, and when 9 or less, miscibility tends to better.

In the copolymer resin (C), the total content of the structural unit derived from an aromatic vinyl compound and the structural unit derived from a maleic anhydride, and the total content of the structural unit represented by the general formula (C-i) and the structural unit represented by the formula (C-ii) each are preferably 50% by mass or more, more preferably 70% by mass or more, even more preferably 90% by mass or more, especially preferably substantially 100% by mass.

The weight average molecular weight (Mw) of the copolymer resin (C) is preferably 4,500 to 18,000, more preferably 5,000 to 18,000, even more preferably 6,000 to 17,000, still more preferably 8,000 to 16,000, further more preferably 8,000 to 15,000, and most preferably 9,000 to 13,000.

When the method of lowering the dielectric constant of an epoxy resin by the use of the copolymer resin (C) is applied to a material for printed wiring board, the penetrability into substrate and the copper foil peel strength often becomes insufficient, and therefore, in general, using the method tends to be evaded. Consequently using the copolymer resin (C) also tends to be evaded. However, the present inventors have found that, though using the copolymer resin (C), a thermosetting resin composition containing the component (A) and the component (B) and having high heat resistance, low relative permittivity, high metal foil adhesion, high glass transition temperature and low thermal expansion and excellent in moldability and platability can be obtained, and on the basis of this finding, the inventors have achieved the present invention.

(Production Method for Copolymer Resin (C))

The copolymer resin (C) can be produced by copolymerizing an aromatic vinyl compound and a maleic anhydride.

The aromatic vinyl compound includes, as described above, styrene, 1-methylstyrene, vinyltoluene, dimethylstyrene, etc. One of them may be used singly or two or more thereof may be used in combination.

Further, in addition to the aromatic vinyl compound and the maleic anhydride, any other various polymerizable components may be copolymerized. Examples of the other various polymerizable components include vinyl compounds such as ethylene, propylene, butadiene, isobutylene, acrylonitrile, etc.; (meth)acryloyl group-having compounds such as methyl acrylate, methyl methacrylate, etc.

A substituent such as an allyl group, a methacryloyl group, an acryloyl group, a hydroxy group or the like may be introduced into the aromatic vinyl compound through Friedel-Crafts reaction or reaction using a metal catalyst such as lithium or the like.

Commercial products can be used for the copolymer resin (C). Examples of the commercial products include "SMA (registered trademark) 1000" (styrene/maleic anhydride=1, Mw=5,000), "SMA (registered trademark) EF30" (styrene/maleic anhydride=3, Mw=9,500), "SMA (registered trademark) EF40" (styrene/maleic anhydride=4, Mw=11,000), "SMA (registered trademark) EF60" (styrene/maleic anhydride=6, Mw=11,500), "SMA (registered trademark) EF80" (styrene/maleic anhydride=8, Mw=14,400) (all manufactured by CRAY VALLEY Inc.), etc.

<(D) Silica Treated with Aminosilane Coupling Agent>

An inorganic filler is added to a thermosetting resin composition for the purpose of lowering the thermal expansion rate of the insulating resin layer, but in the present invention, a silica treated with an aminosilane coupling agent of silicas is used as the component (D). Adding the component (D) to the thermosetting resin composition provides an effect of securing low expansion and good platability and, in addition thereto, also provides an effect of improving adhesion of silica to the components (A) to (C), thereby preventing silica from dropping off, and as a result, there can be obtained an effect of preventing deformation of laser vias owing to excessive desmearing.

Specifically, the aminosilane coupling agent is preferably a silane coupling agent having a silicon-containing group represented by the following general formula (D-1), and an amino group.

(D-1)

In the formula, $R^{D1}$ represents an alkyl group having 1 to 3 carbon atoms, or an acyl group having 2 to 4 carbon atoms, and y represents an integer of 0 to 3.

The alkyl group having 1 to 3 carbon atoms, as represented by $R^{D1}$, includes a methyl group, an ethyl group, an n-propyl group, an isopropyl group. Among these, a methyl group is preferred.

The acyl group having 2 to 4 carbon atoms, as represented by $R^{D1}$, includes an acetyl group, a propionyl group, an acryl group. Among these, an acetyl group is preferred.

The aminosilane coupling agent may have one amino group, or may have two amino groups, or 3 or more amino groups. In general, the agent has one or two amino groups.

Examples of the aminosilane coupling agent having one amino group include 3-aminopropyltrimethoxysilane, 3-aminopropyltriethoxysilane, N-phenyl-3-aminopropyltrimethoxysilane, N-phenyl-3-aminopropyltriethoxysilane, 3-triethoxysilyl-N-(1,3-dimethyl-butylidene)propylamine, 2-propynyl[3-(trimethoxysilyl)propyl] carbamate, etc.

Examples of the aminosilane coupling agent having two amino groups include N-2-(aminoethyl)-3-aminopropylmethyldimethoxysilane, N-2-(aminoethyl)-3-aminopropyltrimethoxysilane, 1-[3-(trimethoxysilyl)propyl]urea, 1-[3-(triethoxysilyl)propyl]urea, etc.

One of the aminosilane coupling agents may be used singly or two or more thereof may be used in combination.

In place of the component (D), when a silica treated with, for example, an epoxysilane coupling agent, a phenylsilane coupling agent, an alkylsilane coupling agent, an alkenylsilane coupling agent, an alkynylsilane coupling agent, a haloalkylsilane coupling agent, a siloxane coupling agent, a hydrosilane coupling agent, a silazane coupling agent, an alkoxysilane coupling agent, a chlorosilane coupling agent, a (meth)acrylsilane coupling agent, an isocyanurate silane coupling agent, an ureidosilane coupling agent, a mercaptosilane coupling agent, a sulfide silane coupling agent, an isocyanate silane coupling agent or the like is used, the adhesion thereof to the above-mentioned components (A) to (C) lowers and the silica tends to often drop off to lower the effect of preventing deformation of laser vias owing to excessive desmearing.

So far as the silica treated with an aminosilane coupling agent (D) is used, an additional silica treated with any other coupling agent as mentioned above may also be used within a range not detracting from the advantageous effects of the present invention.

In the case where the silica treated with any other coupling agent as mentioned above is additionally used, the content thereof is preferably 50 parts by mass or less relative to 100 parts by mass of the silica treated with an aminosilane coupling agent (D), more preferably 30 parts by mass or less, further preferably 15 parts by mass or less, particularly preferably 10 parts by mass or less, and most preferably 5 parts by mass or less.

Examples of the silica for use for the component (D) include a precipitated silica produced according to a wet process and having a high water content, and dry-process silica produced according to a dry process and containing little bound water, etc. The dry-process silica includes a crushed silica, a fumed silica, a molten silica (molten spherical silica), etc., as grouped depending on the production method. The silica is preferably a molten silica from the viewpoint of low thermal expansion and high flowability in charging in resin.

The mean particle size of the silica is not specifically limited but is preferably 0.1 to 10 m, more preferably 0.1 to 6 m, even more preferably 0.1 to 3 m, especially preferably 1 to 3 m. When the mean particle size of the silica is defined to be 0.1 m or more, good flowability in high charging can be secured, and when defined to be 10 m or less, the probability of mixing with coarse particles can be reduced and occurrence of failure owing to coarse particles can be reduced. Here, the mean particle size is a particle size at a point corresponding to 50% volume on a cumulative frequency distribution curve of particle size drawn with the total volume of particles as 100%, and can be measured using a particle sizer or the like according to a laser diffraction scattering method.

The specific surface area of the silica is preferably 4 $m^2/g$ or more, more preferably 4 to 9 $m^2/g$, even more preferably 5 to 7 $m^2/g$.

<(E) Flame Retardant Dispersion>

The thermosetting resin composition of the present invention contains (E) a flame retardant dispersion.

Containing a flame retardant, the thermosetting resin composition of the present invention can have excellent flame retardancy. Further, the thermosetting resin composition of the present invention uses a flame retardant as a dispersion thereof prepared by previously dispersing it in a dispersion medium, and therefore, occurrence of high-density parts can be prevented in the surface of the cured product of the composition.

The flame retardant dispersion (E) is not specifically limited and any one can be used so far as it is a dispersion prepared by dispersing a flame retardant in a dispersion medium.

Examples of the flame retardant to be contained in the flame retardant dispersion (E) include a halogen-containing flame retardant containing bromine, chlorine or the like; a phosphorus-containing flame retardant; a nitrogen-containing flame retardant such as guanidine sulfamate, melamine sulfate, melamine polyphosphate, melamine cyanurate, etc.; phosphazene-type flame retardants such as cyclophosphazene, polyphosphazene, etc.; inorganic flame retardants such as antimony trioxide, etc. Among these, a phosphorus-containing flame retardant is preferred.

The phosphorus-containing flame retardant includes an inorganic phosphorus-containing flame retardant and an organic phosphorus-containing flame retardant. Examples of the inorganic phosphorus-containing flame retardant include red phosphorus; ammonium phosphates such as monoammonium phosphate, diammonium phosphate, triammonium phosphate, ammonium polyphosphate, etc.; inorganic nitrogen-containing phosphorus compounds such as phosphoric acid amide, etc.; phosphoric acid; phosphine oxide, etc.

Examples of the organic phosphorus-containing flame retardant include aromatic phosphates, monosubstituted phosphonic acid diesters, disubstituted phosphinic acid esters, metal salts of disubstituted phosphinic acids, organic nitrogen-containing phosphorus compounds, cyclic organic phosphorus compounds, phosphorus-containing phenolic resins, etc. Among these, aromatic phosphates, and metal salts of disubstituted phosphinic acids are preferred, and metal salts of disubstituted phosphinic acids are more preferred.

Examples of the aromatic phosphate include triphenyl phosphate, tricresyl phosphate, trixylenyl phosphate, cresyldiphenyl phosphate, cresyl-di-2,6-xylenyl phosphate, resorcinol bis(diphenyl phosphate), 1,3-phenylenebis(di-2,6-xylenyl phosphate), bisphenol A-bis(diphenyl phosphate), 1,3-phenylenebis(diphenyl phosphate), etc.

Examples of the monosubstituted phosphonic acid ester include divinyl phenylphosphonate, diallyl phenylphosphonate, bis(1-butenyl) phenylphosphonate, etc.

Examples of the disubstituted phosphinic acid ester include phenyl diphenylphosphinate, methyl diphenylphosphinate, etc.

Examples of the metal salt of a disubstituted phosphinic acid include metal salts of dialkylphosphinic acids, metal salts of diallylphosphinic acids, metal salts of divinylphosphinic acids, metal salts of diarylphosphinic acids, etc. The metal salt is preferably any of a lithium salt, a sodium salt, a potassium salt, a calcium salt, a magnesium salt, an aluminum salt, a titanium salt or a zinc salt, and an aluminium salt is more preferred.

Examples of the organic nitrogen-containing compound include phosphazene compounds such as bis(2-allylphenoxy)phosphazene, dicresylphosphazene, etc.; melamine phosphate, melamine pyrophosphate, melamine polyphosphate, melam polyphosphate, etc.

Examples of the cyclic organic phosphorus compound include 9,10-dihydro-9-oxa-10-phosphaphenanthrene-10-oxide, 10-(2,5-dihydroxyphenyl)-9,10-dihydro-9-oxa-10-phosphaphenanthrene-10-oxide, etc.

One of the flame retardants may be used singly or two or more thereof may be used in combination.

The aromatic phosphate is preferably an aromatic phosphate represented by the following general formula (E-1) or (E-2), and the metal salt of a disubstituted phosphinic acid is preferably a metal salt of a disubstituted phosphinic acid represented by the following general formula (E-3).

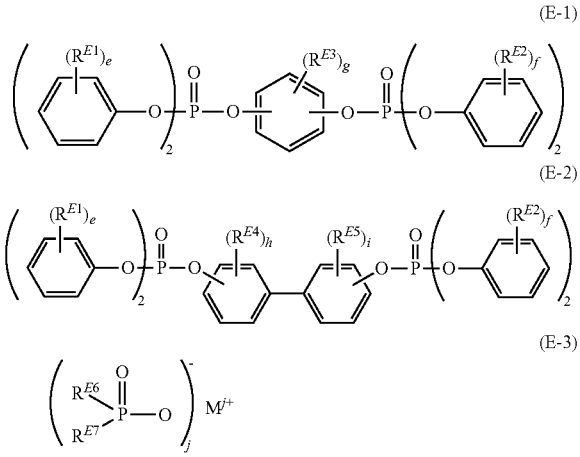

In the formulae, $R^{E1}$ to $R^{E5}$ each independently represent an alkyl group having 1 to 5 carbon atoms, or a halogen atom, e and f each independently represent an integer of 0 to 5, and g, h and i each independently represent an integer of 0 to 4.

$R^{E6}$ and $R^{E7}$ each independently represent an alkyl group having 1 to 5 carbon atoms, or an aryl group having 6 to 14 carbon atoms, M represents a lithium atom, a sodium atom, a potassium atom, a calcium atom, a magnesium atom, an aluminum atom, a titanium atom or a zinc atom, and j represents an integer of 1 to 4.

Examples of the alkyl group having 1 to 5 carbon atoms, as represented by $R^{E1}$ to $R^{E5}$, include a methyl group, an ethyl group, an n-propyl group, an isopropyl group, an n-butyl group, an isobutyl group, a t-butyl group, an n-pentyl group, etc. The alkyl group is preferably an alkyl group having 1 to 3 carbon atoms. Examples of the halogen atom represented by $R^{E1}$ to $R^{E5}$ include a fluorine atom, etc.

e and f are preferably an integer of 0 to 2, more preferably 2. g, h and i are preferably an integer of 0 to 2, more preferably 0 or 1, even more preferably 0.

The alkyl group having 1 to 5 carbon atoms, as represented by $R^{E6}$ and $R^{E7}$, includes the same as those of $R^{E1}$ to $R^{E5}$.

Examples of the aryl group having 6 to 14 carbon atoms, as represented by $R^{E6}$ and $R^{E7}$, include a phenyl group, a naphthyl group, a biphenylyl group, an anthryl group, etc. The aromatic hydrocarbon group is preferably an aryl group having 6 to 10 carbon atoms.

j is the same as the valence of the metal ion, that is, j varies within a range of 1 to 4 depending on the kind of M.

M is preferably an aluminum atom. In the case where M is an aluminum atom, j is 3.

The mean particle size of the flame retardant is, from the viewpoint of effectively preventing occurrence of high-density parts and from the viewpoint of flame retardancy, preferably 0.1 to 8 m, more preferably 0.5 to 6 m, even more preferably 1 to 5 m.

Here, the mean particle size is a particle size at a point corresponding to 50% volume on a cumulative frequency distribution curve of particle size drawn with the total volume of particles as 100%, and can be measured using a particle sizer or the like according to a laser diffraction scattering method.

In the flame retardant dispersion (E), the dispersion medium for dispersing the flame retardant is preferably an organic solvent.

Examples of the organic solvent include alcohol solvents such as ethanol, propanol, butanol, methyl cellosolve, butyl cellosolve, propylene glycol monomethyl ether, etc.; ketone solvents such as acetone, methyl ethyl ketone, methyl isobutyl ketone, cyclohexanone, etc.; ether solvents such as tetrahydrofuran, etc.; aromatic solvents such as toluene, xylene, mesitylene, etc.; nitrogen atom-containing solvents including amide solvents such as dimethylformamide, dimethylacetamide, N-methylpyrrolidone, etc.; sulfur atom-containing solvents including sulfoxide solvents such as dimethyl sulfoxide, etc.; ester solvents such as ethyl acetate, γ-butyrolactone, etc. Among these, ketone solvents are preferred from the viewpoint of preventing occurrence of high-density parts, and methyl ethyl ketone is more preferred.

One of the organic solvents may be used singly or two or more thereof may be used in combination.

The content of the flame retardant and the dispersion medium in the flame retardant dispersion (E) is not specifically limited, but preferably the content of the dispersion medium is 25 to 55 parts by mass relative to 100 parts by mass of the flame retardant, more preferably 30 to 50 parts by mass, even more preferably 35 to 45 parts by mass. When the content of the dispersion medium is 25 parts by mass or more, the flame retardant can be prevented from precipitating, and when 55 parts by mass or less, excellent dispersibility can be secured.

The flame retardant dispersion (E) may contain any other component than the flame retardant and the dispersion medium within a range not detracting from the advantageous effects of the present invention. The total content of the flame retardant and the dispersion medium in the flame retardant dispersion (E) is preferably 80% by mass or more, more preferably 90% by mass or more, even more preferably 95% by mass or more. The upper limit is not specifically limited, and may be 100% by mass or less, or may be substantially 100% by mass.

<(F) Curing Agent>

The thermosetting resin composition may further contain (F) a curing agent. Examples of the curing agent (F) include dicyandiamide; linear aliphatic amines except dicyandiamide, such as ethylenediamine, diethylenetriamine, triethylenetetramine, tetraethylenepentamine, hexamethylenediamine, diethylaminopropylamine, tetramethylguanidine, triethanolamine, etc.; cyclic aliphatic amines such as isophoronediamine, diaminodicyclohexylmethane, bis(aminomethyl)cyclohexane, bis(4-amino-3-methyldicyclohexyl) methane, N-aminoethylpiperazine, 3,9-bis(3-aminopropyl)-2,4,8,10-tetroxaspiro[5.5]undecane, etc.; aromatic amines such as xylenediamine, phenylenediamine, diaminodiphenylmethane, diaminodiphenyl sulfone, etc. Among these, dicyandiamide is preferred from the viewpoint of metal foil adhesion and low thermal expansion.

The dicyandiamide is represented by $H_2N-C(=NH)-NH-CN$, and the melting point thereof is generally 205 to 215° C., but the melting point thereof having a higher purity is 207 to 212° C. The dicyandiamide is a crystalline substance, and may be a rhombic crystal or may be a tabular crystal. The dicyandiamide is preferably one having a purity of 98% or more, more preferably a purity of 99% or more, even more preferably a purity of 99.4% or more. Commercial products may be used as the dicyandiamide, and, for example, those manufactured by Nippon Carbide Industries Co., Ltd., Tokyo Chemical Industry Co., Ltd., Kishida Chemical Co., Ltd., Nacalai Tesque Inc., etc.

Dicyandiamide and the like have an effect of a flame retardant, but in the present invention, those capable of functioning as a curing agent are grouped in the component (F) and are excluded from the component (E).

(Content of Each Component)

In the thermosetting resin composition, the content of the component (A) is not specifically limited, but is preferably 15 to 65 parts by mass relative to the sum total, 100 parts by mass, of the components (A) to (C), more preferably 30 to 55 parts by mass, even more preferably 40 to 50 parts by mass. When the content of the component (A) is 15 parts by mass or more, the composition tends to secure high heat resistance, low relative permittivity, high glass transition temperature and low thermal expansion. On the other hand, when the content is 65 parts by mass or less, the thermosetting resin composition tends to have good flowability and moldability.

In the thermosetting resin composition, the content of the component (B) is not specifically limited, but is preferably 15 to 50 parts by mass relative to the sum total, 100 parts by mass, of the components (A) to (C), more preferably 20 to 40 parts by mass, even more preferably 25 to 35 parts by mass. When the content of the component (B) is 15 parts by mass or more, the composition tends to secure high heat resistance, high glass transition temperature and low thermal expansion. On the other hand, when the content is 50 parts by mass or less, the composition tends to secure high heat resistance, low relative permittivity, high glass transition temperature and low thermal expansion.

In the thermosetting resin composition, the content of the component (C) is not specifically limited, but is preferably 10 to 45 parts by mass relative to the sum total, 100 parts by mass, of the components (A) to (C), more preferably 15 to 35 parts by mass, even more preferably 20 to 30 parts by mass. When the content of the component (C) is 10 parts by mass or more, the composition tends to secure high heat resistance and low relative permittivity. On the other hand, when the content is 45 parts by mass or less, the composition tends to secure high heat resistance, high metal foil adhesion and low thermal expansion.

In the thermosetting resin composition, the content of the component (D) is not specifically limited, but is preferably 30 to 70 parts by mass relative to the sum total, 100 parts by mass, of the components (A) to (C), more preferably 30 to 70 parts by mass, even more preferably 40 to 60 parts by mass, still more preferably 45 to 55 parts by mass. When the content of the component (D) is 30 parts by mass or more, the composition tends to be excellent in low thermal expansion. On the other hand, when the content is 70 parts by mass or less, the thermosetting resin composition tends to have heat resistance, and tends to have good flowability and moldability.

In the thermosetting resin composition, the content of the component (E) is not specifically limited, but preferably the amount thereof is to have a flame retardant content of 0.1 to 20 parts by mass relative to the sum total, 100 parts by mass, of the components (A) to (C), more preferably 1 to 15 parts by mass, even more preferably 3 to 12 parts by mass, still more preferably 5 to 10 parts by mass, and most preferably 7 to 10 parts by mass. When the flame retardant content is 0.1 parts by mass or more, the composition tends to have excellent flame retardancy, but on the other hand, when 20 parts by mass or less, the composition tends to be excellent in moldability and tends to effectively prevent occurrence of high-density parts.

In particular, in the case where a phosphorus-containing flame retardant is used as the component (E), the content thereof is preferably 0.02 to 5 parts by mass in terms of the phosphorus atom content, relative to the sum total 100 parts by mass of the components (A) to (C), more preferably 0.2 to 4 parts by mass, even more preferably 0.5 to 3 parts by mass, especially preferably 1.0 to 2.7 parts by mass, and most preferably 1.5 to 2.5 parts by mass. When the phosphorus atom content is 0.02 parts by mass or more, the composition tends to have excellent flame retardancy. On the other hand, when 5 parts by mass or less, the composition tends to be excellent in moldability and tends to effectively prevent occurrence of high-density parts.

In addition, in the case where the component (F) is added to the thermosetting resin composition of the present invention, the content thereof is preferably 0.5 to 6 parts by mass relative to the sum total, 100 parts by mass, of the components (A) to (C), more preferably 0.7 to 4 parts by mass, even more preferably 1 to 3 parts by mass. When the content of the component (F) is 0.5 parts by mass or more, the composition tends to have high metal foil adhesion and excellent low thermal expansion. On the other hand, when 6 parts by mass or less, the composition tends to have high heat resistance.

<Other Components>

The thermosetting resin composition of the present invention may optionally contain any other solvents such as additives, organic solvent and the like, within a range not detracting from the advantageous effects of the present invention. One alone or two or more of such other components may be contained in the composition.

(Additives)

Examples of the additives include a curing accelerator, a colorant, an antioxidant, a reducing agent, a UV absorbent, a fluorescent whitening agent, an adhesion improver, an organic filler, etc.

(Organic Solvent)

The thermosetting resin composition may contain an organic solvent from the viewpoint of diluting the composition to facilitate handling thereof and from the viewpoint of facilitating production of prepreg to be mentioned hereinunder. In this description, the thermosetting resin composition containing an organic solvent may be referred to as a resin varnish.

The organic solvent is not specifically limited, and examples thereof include alcohol solvents such as methanol, ethanol, ethylene glycol, ethylene glycol monomethyl ether, ethylene glycol monoethyl ether, diethylene glycol, triethylene glycol monomethyl ether, triethylene glycol monoethyl ether, triethylene glycol, propylene glycol monomethyl ether, dipropylene glycol monomethyl ether, propylene glycol monopropyl ether, dipropylene glycol monopropyl ether, etc.; ketone solvents such as acetone, methyl ethyl ketone, methyl isobutyl ketone, cyclohexanone, etc.; ether solvents such as tetrahydrofuran, etc.; aromatic solvents such as toluene, xylene, mesitylene, etc.; nitrogen atom-containing solvents including amide solvents such as formamide, N-methylformamide, N,N-dimethylformamide, N,N-dimethylacetamide, N-methylpyrrolidone, etc.; sulfur atom-containing solvents including sulfoxide solvents such as dimethyl sulfoxide, etc.; ester solvents such as methoxyethyl acetate, ethoxyethyl acetate, butoxyethyl acetate, propylene glycol monomethyl ether acetate, ethylacetate, etc.

Among these, alcohol solvents, ketone solvents and nitrogen atom-containing solvents are preferred from the viewpoint of solubility, methyl ethyl ketone, methyl isobutyl ketone, cyclohexanone, methyl cellosolve and propylene glycol monomethyl ether are more preferred, methyl ethyl ketone and methyl isobutyl ketone are even more preferred, and methyl ethyl ketone is especially preferred.

One of the organic solvents may be used singly or two or more may be used in combination.

The content of the organic solvent in the thermosetting resin composition is not specifically limited but may be adequately so controlled as to facilitate handling of the thermosetting resin composition within a range that betters the coatability with the resin varnish. The solid concentration derived from the thermosetting resin composition (the concentration of the components except the organic solvent in the composition) is preferably 30 to 90% by mass, more preferably 40 to 80% by mass, even more preferably 50 to 80% by mass.

The thermosetting resin composition of the present invention is preferably such that the number of high-density parts of 50 m or more observed in the surface of the cured product thereof as produced under the condition mentioned below is 5 or less, more preferably 2 or less, even more preferably 0. The cured product of the thermosetting resin composition means an evaluation substrate obtained by processing the copper-clad laminate produced according to the production process for a thermosetting resin composition, a prepreg and a copper-clad laminate described in the section of Examples, according to the treatment described for the "appearance inspection" of the evaluation points in the section of Examples, and the number of high-density parts is measured according to the measurement method for high-density parts as described relating to the "appearance inspection" of the evaluation points in Examples.

<Production Method for Thermosetting Resin Composition>

Preferably, the thermosetting resin composition of the present invention is produced according to a production method including the following steps 1 and 2.

Step 1: A step of dispersing a flame retardant in a dispersion medium to prepare (E) a flame retardant dispersion, Step 2: A step of mixing (A) a maleimide compound, (B) an epoxy resin having at least two epoxy groups in one molecule, (C) a copolymer resin having a structural unit derived from an aromatic vinyl compound and a structural unit derived from a maleic anhydride, (D) a silica treated with an aminosilane coupling agent, and (E) the flame retardant dispersion prepared in the step 1.

(Step 1)

The step 1 is a step of dispersing a flame retardant in a dispersion medium to prepare (E) a flame retardant dispersion.

Any known mixing method is applicable to the method of dispersing a flame retardant in a dispersion medium. Examples of the mixing machine for use for mixing include ultrasonic dispersion-system, high-pressure collision dispersion-system, high-speed rotation dispersion-system, bead mill-system, high-speed shear dispersion-system, rotation and revolution dispersion-system and the like mixing machines. The flame retardant dispersion (E) can be favorably prepared by fully stirring the components using any such mixing machine.

The amount of the flame retardant and the dispersion medium to be used in preparing the flame retardant dispersion (E) may be the same as the preferred content of the flame retardant and the dispersion medium in the flame retardant dispersion (E) mentioned above.

(Step 2)

The step 2 is a step of mixing the flame retardant dispersion (E) prepared in the above, with the component (A), the component (B), the component (C) and the component (D). In the step 2, if desired, any other components mentioned above may be mixed together.

Any known mixing method is applicable to the mixing method in the step 2. Examples of the mixing machine include ultrasonic dispersion-system, high-pressure collision dispersion-system, high-speed rotation dispersion-system, bead mill-system, high-speed shear dispersion-system, rotation and revolution dispersion-system and the like mixing machines. The thermosetting resin composition can be favorably prepared by fully mixing the components using any such mixing machine.

In this step, an organic solvent may be added for controlling the solid concentration derived from the thermosetting resin composition as mentioned above.

[Prepreg]

The prepreg of the present invention contains the thermosetting resin composition of the present invention.

The production method for the prepreg of the present invention is not specifically limited. For example, the prepreg may be produced by impregnating or applying the thermosetting resin composition to a sheet-like reinforcing substrate followed by semicuring it by heating or the like (for conversion into B-stage).

As the sheet-like reinforcing substrate for the prepreg, any well-known one that is used in laminates for various electric insulating materials can be used. The material of the sheet-like reinforcing substrate includes natural fibers such as paper, cotton linter, etc.; inorganic fibers such as glass fibers, asbestos, etc.; organic fibers such as aramid, polyimide, polyvinyl alcohol, polyester, tetrafluoroethylene, acryl, etc.; mixtures thereof, etc. Among these, glass fibers are preferred from the viewpoint of flame retardancy. Glass fiber substrates include glass woven fabrics prepared by bonding woven fabrics or short fibers of E glass, C glass, D glass, S glass or the like with an organic binder; those prepared by mixing glass fibers and cellulose fibers followed by sheeting the resultant mixture, etc. A glass woven fabric using E glass is more preferred.

These sheet-like reinforcing substrates have various shapes of, for example, woven fabric, nonwoven fabric, roving, chopped strand mat, surfacing mat, etc.

The material and the shape can be selected depending on the use and the performance of the intended molded article, and one alone or, as needed, two or more kinds of materials and shapes can be used either singly or as combined.

The thickness of the sheet-like reinforcing substrate is not specifically limited, and may be, for example, about 0.03 to 0.5 mm. From the viewpoint of heat resistance, moisture resistance and workability those surface-treated with a silane coupling agent or the like as well as those prepared by mechanically opening fibers are preferred.

As the method of infiltrating or applying the thermosetting resin composition to the sheet-like reinforcing substrate, a hot melt method or a solvent method is preferred.

In the hot melt method, an organic solvent is not added to the thermosetting resin composition, and the method may be any of (1) a method of once applying the composition onto a coated paper that is well peelable from the composition followed by laminating the resultant coating onto a sheet-like reinforcing substrate, or (2) a method of directly applying the composition onto a sheet-like reinforcing substrate with a die coater.

On the other hand, the solvent method is a method of adding an organic solvent to the thermosetting resin composition to prepare a varnish, then immersing a sheet-like reinforcing substrate in the varnish to thereby infiltrate the varnish into the sheet-like reinforcing substrate, and thereafter drying it.

After infiltrated or applied to a substrate, in general, the thermosetting resin composition is dried preferably by heating at a temperature of 100 to 200° C. for 1 to 30 minutes for semicuring (conversion into B-stage), thereby giving a prepreg of the present invention.

One alone or, if desired, plural sheets, preferably 2 to 20 sheets of the prepreg of the present invention may be used either singly or as combined.

[Laminate]

The laminate of the present invention contains the above-mentioned prepreg.

The production method for the laminate of the present invention is not specifically limited. For example, using one sheet or, as needed, 2 to 20 sheets of the prepreg of the present invention either singly or as layered, a metal foil is arranged on one surface or on both surfaces of the sheet(s) and molded to produce the laminate. The metal foil-arranged laminate may be referred to as a metal-clad laminate.

The metal for the metal foil may be any one used for electric insulating materials with no limitation, but from the viewpoint of electroconductivity, the metal is preferably copper, gold, silver, nickel, platinum, molybdenum, ruthenium, aluminum, tungsten, iron, titanium, chromium, or an alloy containing at least one of these metal elements, and is more preferably copper or aluminium, even more preferably copper.

Regarding the molding condition for the laminate, any known molding method for laminates and multilayer plates for electric insulating materials may be employed. As the molding machine, for example, a multistage press, a multistage vacuum press, a continuous molding machine, an autoclave molding machine or the like may be used for molding under a condition of, for example, a temperature of 100 to 250° C., a pressure of 0.2 to 10 MPa, and a heating time of 0.1 to 5 hours.

The prepreg of the present invention may be combined with a printed wiring board for an inner layer, and molded in lamination to produce a multilayer sheet.

The thickness of the metal foil is not specifically limited, and may be adequately selected in accordance with the use of printed wiring boards, etc. The thickness of the metal foil is preferably 0.5 to 150 m, more preferably 1 to 100 m, even more preferably 5 to 50 m, especially preferably 5 to 30 m.

Preferably a plating layer may be formed on the metal foil by plating.

The metal for the plating layer is not specifically limited so far as it is a platable metal, and examples thereof include the same as those for use for the metal foil mentioned above.

The plating method is not specifically limited, and any known method, for example, an electrolytic plating method, an electroless plating method or the like is employable.

[Printed Wiring Board]

The printed wiring board of the present invention is a printed wiring board containing the prepreg of the present invention or the laminate of the present invention.

The printed wiring board of the present invention can be produced, for example, by working the metal foil of the metal-clad laminate for forming electric circuits thereon. Working for electric circuit formation can be attained, for example, by forming a resist pattern on the surface of a metal foil, then removing the unnecessary part of the metal foil by etching, removing the resist pattern, forming necessary through-holes by drilling, again forming a resist pattern, plating the through-holes for electroconduction, and finally removing the resist pattern. The above-mentioned metal-clad laminate is further laminated on the surface of the resultant printed wiring board under the same condition as mentioned above, and this is further worked for circuit formation in the same manner as above to give a multilayer printed wiring board. In this case, formation of though-holes is not always necessary and via holes may be formed, or both of them may be formed. Such multilayer formation is carried out for the necessary number of layers to be layered.

EXAMPLES

Next, the present invention is descried in more detail with reference to Examples given hereinunder, but these Examples are not whatsoever intended to restrict the present invention. Using the thermosetting resin composition of the present invention, a prepreg and further a copper-clad laminate were produced, and the resultant copper-clad laminate was evaluated. The evaluation methods are shown below.

[Evaluation Methods]

<1. Heat Resistance (Reflow Soldering Heat Resistance)>

The four-layered copper-clad laminate produced in each Example was led to pass through a constant-temperature tank at 260° C. or higher (highest achieving temperature 266° C.) for 30 seconds as one cycle, and the cycle was repeated. The number of cycles in which the four-layered copper-clad laminate was visually confirmed to have swollen was counted. A larger number of cycles indicates more excellent heat resistance.

<2. Relative Permittivity (Dk)>

Using a network analyzer "8722C" (manufactured by HP Development Company) and according to a tri-plate structure straight path resonator method, the relative permittivity of the double-sided copper-clad laminate at 1 GHz was measured at 25° C. The sample size was 200 mm×50 mm×0.8 mm thickness, and a linear path having a width of 1.0 mm (line length 200 mm) was formed by etching in the center of one surface of one double-sided copper-clad laminate, and on the back thereof, copper was kept remaining to be a ground layer. One surface of another double-sided copper-clad laminate was totally etched, and the back thereof was made to be a ground layer. These two double-sided copper-clad laminates were layered with the ground layer thereof kept outside to be a strip path.

<3. Metal Foil Adhesion (Copper Foil Peel Strength)>

The metal foil adhesion was evaluated based on the copper foil peel strength. The double-sided copper-clad laminate produced in Examples was immersed in a copper etchant "ammonium persulfate (APS)" (manufactured by ADEKA Corporation) to form a copper foil having a width of 3 mm and an evaluation substrate was thus prepared. Using an autograph "AG-100C" (manufactured by Shimadzu Corporation), the copper foil peel strength of the sample was measured. A larger value indicates more excellent metal foil adhesion.

<4. Glass Transition Temperature (Tg)>

The double-sided copper-clad laminate produced in Examples was immersed in a copper etchant "ammonium persulfate (APS)" (manufactured by ADEKA Corporation) to remove the copper foil, thereby preparing an evaluation substrate of 5 mm square. Using a TMA tester "Q400EM" (manufactured by TA Instruments Corporation), the thermal expansion curve at 30 to 260° C. in the plane direction (Z direction) of the evaluation substrate was drawn, and the inflection point of the expansion is referred to as the glass transition temperature.

<5. Low Thermal Expansion (Thermal Expansion Rate)>

The double-sided copper-clad laminate produced in Examples was immersed in a copper etchant "ammonium persulfate (APS)" (manufactured by ADEKA Corporation) to remove the copper foil, thereby preparing an evaluation substrate of 5 mm square. Using a TMA tester "Q400EM" (manufactured by TA Instruments Corporation), the thermal expansion rate (linear thermal expansion rate) in the plane direction of the evaluation substrate was measured. For removing the influence of heat strain of the evaluation substrate, the heating-cooling cycle was repeated twice, and on the second-run temperature fluctuation chart, the thermal expansion rate at 30° C. to 260° C. [ppm/° C.] was read to be the index of low thermal expansion characteristic. A smaller value indicates more excellent low thermal expansion. In the Table, the data were separately shown as the thermal expansion rate at lower than Tg (expressed as "<Tg") and as the thermal expansion rate at higher than Tg (expressed as ">Tg").

Measurement Condition

1st run: room temperature→210° C. (heating rate 10° C./min)

2nd run: 0° C.→270° C. (heating rate 10° C./min)

<6. Platability (Laser Workability)>

Using a laser machine "LC-2F21B/2C" (manufactured by Hitachi Via Mechanics, Ltd.), the four-layer copper-clad laminate produced in Examples was worked for laser holing according to a copper direct method in a Gaussian cycle-by-cycle mode with a targeted hole diameter of 80 m, a pulse width of 15 μs×once and 7 μs×four times, thereby preparing a laser-holed substrate.

The resultant laser-holed substrate was processed with a swelling liquid "Swelling Dip Securiganth (registered trademark) P" (manufactured by Atotech Japan, Ltd.) at 70° C. for 5 minutes, then processed with a roughening liquid "Dosing Securiganth (registered trademark) P500J" (manufactured by Atotech Japan, Ltd.) at 70° C. for 9 minutes, and thereafter processed with a neutralizing liquid "Reduction Conditioner Securiganth (registered trademark) P500" (manufactured by Atotech Japan, Ltd.) at 40° C. for 5 minutes for desmearing treatment. Subsequently using an electroless plating liquid "Printganth (registered trademark) MSK-DK" (manufactured by Atotech Japan, Ltd.), this was electrolessly plated at 30° C. for 20 minutes, and then using an electrolytic plating liquid "Cupracid HL" (manufactured by Atotech Japan, Ltd.), this was electrolytically plated at 24° C. and at 2 A/dm$^2$ for 2 hours.

The cross section of the resultant laser-holed substrate was observed to confirm the platability thereof. Regarding the evaluation method for platability, the difference between the plating thickness at the top of the laser hole and the plating thickness at the bottom of the laser hole was calculated, and when the difference was within 10% of the plating thickness at the top of the laser hole, the platability was considered to be good. The proportion of the holes (%) falling within the range of 100 holes was calculated.

<7. Moldability>

Copper of each outer layer was removed from the four-layer copper-clad laminate produced in Examples, and the presence or absence of void or obscure appearance in a plane of 340×500 mm was confirmed visually. The case with neither void nor obscure appearance was evaluated as "good". Absence of void and obscure appearance indicates good moldability.

<8. Appearance Inspection (Number of High-Density Parts)>

The double-sided copper-clad laminate produced in Examples was immersed in a copper etchant "ammonium persulfate (APS)" (manufactured by ADEKA Corporation) to remove the copper foil, thereby preparing an evaluation substrate of 500 mm square. Using an automatic appearance inspection device "Discovery-OLB" (manufactured by Orbotech Ltd.), the appearance of the evaluation substrate was checked. Regarding the appearance inspection method, the number of high-density parts having a size of 50 m or more was counted. A smaller number of high-density parts indicates more excellent appearance.

The components used in Examples and Comparative Examples are described below.

Component (A): Dimethylacetamide solution of maleimide compound having acidic substituent and N-substituted maleimide group, produced in Production Example 1 mentioned below.

Production Example 1

19.2 g of 4,4'-diaminodiphenylmethane, 174.0 g of bis(4-maleimidephenyl)methane, 6.6 g of p-aminophenol and 330.0 g of dimethylacetamide were put in a reactor equipped with a thermometer, a stirrer and a water metering device with a reflux condenser tube and having a volume of 1 L, and reacted therein at 100° C. for 2 hours to give a dimethylacetamide solution of a maleimide compound having an acidic substituent and an N-substituted maleimide group (Mw=1,370).

The weight average molecular weight (Mw) was determined through gel permeation chromatography (GPC) with a standard polystyrene-equivalent calibration curve. The calibration curve was approximated in a cubic equation using standard polystyrene: TSK standard POLYSTYRENE (Type: A-2500, A-5000, F-1, F-2, F-4, F-10, F-20, F-40) (manufactured by Tosoh Corporation). The GPC measurement condition is shown below.

Apparatus:

Pump: L-6200 Model (manufactured by Hitachi High Technologies, Ltd.)

Detector: L-3300 Model RI (manufactured by Hitachi High Technologies, Ltd.)

Column Oven: L-655A-52 (manufactured by Hitachi High Technologies, Ltd.)

Columns: TSKgel Super HZ2000+TSKgel Super HZ2300 (all manufactured by Tosoh Corporation)

Column Size: 6.0×40 mm (guard column), 7.8×300 mm (column)

Eluent: tetrahydrofuran

Sample Concentration: 20 mg/5 mL

Injection Amount: 10 μL

Flow Rate: 0.5 mL/min

Measurement Temperature: 40° C.

Component (B): Cresol-novolak epoxy resin "EPICLON (registered trademark) N-673" (manufactured by DIC Corporation, epoxy equivalent: 205 to 215 g/eq)

Component (C-1): Copolymer resin of styrene and maleic anhydride "SMA (registered trademark) EF40" (styrene/maleic anhydride=4, Mw=11,000, manufactured by Cray Valley Corporation)

Component (C-2): Copolymer resin of styrene and maleic anhydride "SMA (registered trademark) 3000" (styrene/maleic anhydride=2, Mw=7,500, manufactured by Cray Valley Corporation)

Component (C-3): Copolymer resin of styrene and maleic anhydride "SMA (registered trademark) EF80" (styrene/maleic anhydride=8, Mw=14,400, manufactured by Cray Valley Corporation)
Component (C-4): Copolymer resin of styrene and maleic anhydride "SMA (registered trademark) 1000" (styrene/maleic anhydride=1, Mw=5,000, manufactured by Cray Valley Corporation)
Component (D): "Megasil 525 ARI" (molten silica treated with aminosilane coupling agent, mean particle diameter; 1.9 m, specific surface area 5.8 m$^2$/g, manufactured by Sibelco Japan, Inc.)
Component (E): Flame retardant dispersion produced in Production Example 2 mentioned below.

Production Example 2

100 parts by mass of "OP-935" (aluminum trisdiethylphosphinate, manufactured by Clariant Japan K.K., phosphorus atom content 23% by mass, mean particle diameter: 2 to 3 m) was mixed with 42.8 parts by mass of methyl ethyl ketone and fully stirred to prepare a flame retardant dispersion.
Component (E'): "OP-935" (aluminum phosphinate, manufactured by Clariant Japan K.K., phosphorus atom content 23% by mass, mean particle diameter: 2 to 3 m) was used directly as a powder, not formed into a dispersion.
Component (F): Dicyandiamide (manufactured by Nippon Carbide Industries Co., Inc.)

Examples 1 to 4, Comparative Example 1

(Production of Thermosetting Resin Composition and Prepreg)
The components mentioned above were blended in the formulation shown in Table 1 (in the case of a solution or a dispersion, the formulation is in terms of the solid content of each component), then fully stirred, and methyl ethyl ketone was added thereto so that the solid concentration in the resultant thermosetting resin composition could be 65 to 75% by mass, thereby preparing thermosetting resin compositions of Examples and Comparative Example.

The resultant thermosetting resin composition was infiltrated into a glass cloth (0.1 mm) of IPC Standard #3313, and dried at 160° C. for 4 minutes to produce a prepreg.
(Production of Double-Sided Copper-Clad Laminate)
Eight sheets of the prepreg produced in the above were layered, and an 18 m-thick copper foil "3EC-VLP-18" (manufactured by Mitsui Metal Mining & Smelting Co., Ltd.) was further layered on both surfaces of the resultant structure, and molded by thermal pressing at a temperature of 190° C. and a pressure of 25 kgf/cm$^2$ (2.45 MPa) for 90 minutes, thereby producing a double-sided copper-clad laminate having a thickness of 0.8 mm (corresponding to 8 sheets of prepreg). According to the above-mentioned methods, the double-sided copper-clad laminate was evaluated for the relative permittivity the metal foil adhesion, the glass transition temperature (Tg), the low thermal expansion and the appearance inspection. The results are shown in Table 1.
(Production of 4-Layer Copper-Clad Laminate)
On the other hand, one sheet of the prepreg produced in the above was used, and an 18 m-thick copper foil "YGP-18" (manufactured by Nippon Denkai, Ltd.) was layered on both surfaces of one sheet of the prepreg produced in the above, and molded by thermal pressing at a temperature of 190° C. and a pressure of 25 kgf/cm$^2$ (2.45 MPa) for 90 minutes, thereby producing a double-sided copper-clad laminate having a thickness of 0.1 mm (corresponding to one sheet of prepreg). Next, using a "BF processing liquid" (manufactured by Hitachi Chemical Co., Ltd.), both copper foil surfaces of the double-sided copper-clad laminate were performed for inner layer adhesion reinforcement treatment. Subsequently one sheet of the prepreg having a thickness of 0.05 mm and an 18 m-thick copper foil "YGP-18" (manufactured by Nippon Denkai, Ltd.) were layered in that order on both copper foil surfaces of the inner layer adhesion reinforcement-treated, double-sided copper-clad laminate and molded by thermal pressing at a temperature of 190° C. and a pressure of 25 kgf/cm$^2$ (2.45 MPa) for 90 minutes, thereby producing a four-layer copper-clad laminate. According to the above-mentioned methods, the four-layer copper-clad laminate was evaluated for the heat resistance, the platability and the moldability. The results are shown in Table 1.

TABLE 1

| | | | | Example | | | | Comparative Example |
|---|---|---|---|---|---|---|---|---|
| | | Unit | 1 | 2 | 3 | 4 | | 1 |
| Components | Component (A) | part by mass | 45 | 45 | 45 | 45 | | 45 |
| | Component (B) | part by mass | 30 | 30 | 30 | 30 | | 30 |
| | Component (C-1) | part by mass | 25 | — | — | — | | 25 |
| | Component (C-2) | part by mass | — | 25 | — | — | | — |
| | Component (C-3) | part by mass | — | — | 25 | — | | — |
| | Component (C-4) | part by mass | — | — | — | 25 | | — |
| | Component (D) | part by mass | 50 | 50 | 50 | 50 | | 50 |
| | Component (E)*[1] | part by mass | 8.7 (2) | 8.7 (2) | 8.7 (2) | 8.7 (2) | | — |
| | Component (E')*[1] | part by mass | — | — | — | — | | 8.7 (2) |
| | Component (F) | part by mass | 2 | 2 | 2 | 2 | | 2 |
| Evaluation Results | 1. Heat Resistance | number of cycles | >10 | >10 | >10 | >10 | | >10 |
| | 2. Relative Permittivity (1 GHz) | — | 3.8 | 3.9 | 3.8 | 4.0 | | 3.8 |
| | 3. Copper Foil Peel Strength | kN/m | 1.1 | 1.1 | 1.0 | 1.1 | | 1.2 |
| | 4. Glass Transition Temperature (Tg) | ° C. | 157 | 160 | 161 | 160 | | 158 |
| | 5. Thermal Expansion Rate  <Tg | ppm/° C. | 44 | 43 | 44 | 43 | | 46 |
| | >Tg | ppm/° C. | 209 | 211 | 215 | 215 | | 208 |
| | 6. Platability | % | 86 | 81 | 82 | 88 | | 85 |
| | 7. Moldability | — | good | good | good | good | | good |
| | 8. Appearance Inspection (number of high-density parts) | number | 0 | 0 | 0 | 0 | | 20 |

*[1]The parenthesized value means the phosphorus atom-equivalent amount (part by mass).

In Examples 1 to 4, the reflow soldering heat resistance attained 10 cycles or more above the required heat resistance level, and the samples all realized low relative permittivity, high copper foil peel strength and high glass transition temperature, and in addition, exhibited low thermal expansion. In addition, in Examples 1 to 4, glass cloth adequately protruded out from the wall surface and the wall surface adequately roughened, and therefore the samples were confirmed to have good platability. In Examples 1 to 4, the resin were well buried in point moldability, and any abnormalities of obscure appearance, voids and the like were not detected. Further, in the appearance inspection, high-density parts were not seen.

On the other hand, in Comparative Example 1 where the flame retardant dispersion (E) was not used but a powder flame retardant was used, many high-density parts were seen.

INDUSTRIAL APPLICABILITY

The thermosetting resin composition of the present invention has high heat resistance, low relative permittivity, high metal foil adhesion, high glass transition temperature and low thermal expansion, and is excellent in moldability and platability, and in addition, the cured product of the composition is prevented from having high-density parts in the surface thereof. Accordingly the thermosetting resin composition is useful for printed wiring boards for electronic devices.

The invention claimed is:

1. A method for producing a thermosetting resin composition that comprises:
  (A) a maleimide compound having an acidic substituent and an N-substituted maleimide group, which is obtained by reacting (a1) a maleimide compound having at least two N-substituted maleimide groups in one molecule, (a2) a monoamine compound having an acidic substituent, and (a3) a diamine compound,
  (B) an epoxy resin having at least two epoxy groups in one molecule,
  (C) a copolymer resin having a structural unit derived from an aromatic vinyl compound and a structural unit derived from a maleic anhydride,
  (D) a silica treated with an aminosilane coupling agent, and
  (E) a flame retardant dispersion,
the method comprising the following steps 1 and 2:
  step 1: a step of dispersing a flame retardant in a dispersion medium to prepare (E) a flame retardant dispersion, wherein the flame retardant has a mean particle size of 0.1 to 8 μm; and
  step 2: a step of mixing (A) a maleimide compound, (B) an epoxy resin having at least two epoxy groups in one molecule, (C) a copolymer resin having a structural unit derived from an aromatic vinyl compound and a structural unit derived from a maleic anhydride, (D) a silica treated with an aminosilane coupling agent, and (E) the flame retardant dispersion prepared in the step 1.

2. The method for producing a thermosetting resin composition according to claim 1, wherein the component (E) is a dispersion of a flame retardant dispersed in an organic solvent, and the content of the organic solvent in the component (E) is from 25 to 55 parts by mass relative to 100 parts by mass of the flame retardant.

3. The method for producing a thermosetting resin composition according to claim 1, wherein the component (E) comprises a metal salt of a di-substituted phosphinic acid as a flame retardant.

4. The method for producing a thermosetting resin composition according to claim 1, wherein the component (E) comprises a ketone solvent as an organic solvent.

5. The method for producing a thermosetting resin composition according to claim 1, wherein the component (a2) is a monoamine compound having an acidic substituent represented by the following general formula (a2-1), and the component (a3) is a diamine compound represented by the following general formula (a3-1):

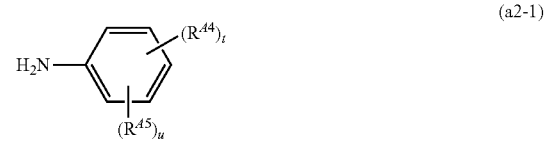

(a2-1)

wherein $R^{A4}$ represents an acidic substituent selected from a hydroxy group, a carboxy group and a sulfonic acid group, $R^{A5}$ represents an alkyl group having 1 to 5 carbon atoms, or a halogen atom, t represents an integer of 1 to 5, u represents an integer of 0 to 4, and t and u satisfy $1 \leq t+u \leq 5$, provided that when t is an integer of 2 to 5, plural $R^{A4}$'s may be the same or different, and when u is an integer of 2 to 4, plural $R^{A5}$'s may be the same or different,

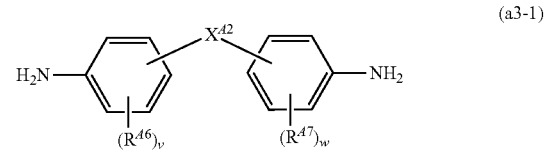

(a3-1)

wherein $X^{A2}$ represents an aliphatic hydrocarbon group having 1 to 3 carbon atoms, or —O—, $R^{A6}$ and $R^{A7}$ each independently represent an alkyl group having 1 to 5 carbon atoms, a halogen atom, a hydroxy group, a carboxy group or a sulfonic acid group, and v and w each independently represent an integer of 0 to 4.

6. The method for producing a thermosetting resin composition according to claim 1, wherein the component (C) is a copolymer resin having a structural unit represented by the following general formula (C-i) and a structural unit represented by the following formula (C-ii):

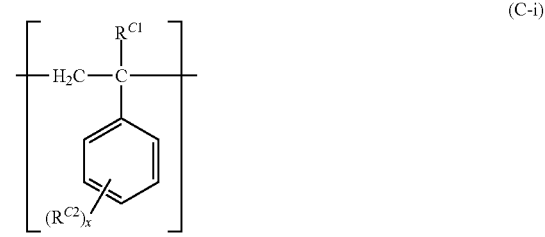

(C-i)

(C-ii)

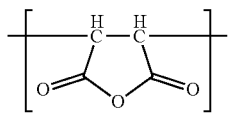

wherein $R^{C1}$ represents a hydrogen atom, or an alkyl group having 1 to 5 carbon atoms, $R^{C2}$ represents an alkyl group having 1 to 5 carbon atoms, an alkenyl group having 2 to 5 carbon atoms, an aryl group having 6 to 20 carbon atoms, a hydroxy group, or a (meth) acryloyl group, and x represents an integer of 0 to 3, provided that when x is 2 or 3, plural $R^{C2}$'s may be the same or different.

7. The method for producing a thermosetting resin composition according to claim 1, wherein in the component (C), the content ratio of the structural unit derived from an aromatic vinyl compound to the structural unit derived from a maleic anhydride [aromatic vinyl compound-derived structural unit/maleic anhydride-derived structural unit] (molar ratio) is from 1 to 9.

8. The method for producing a thermosetting resin composition according to claim 1, wherein the weight average molecular weight of the component (C) is from 4,500 to 18,000.

9. The method for producing a thermosetting resin composition according to claim 1, wherein the component (B) is one or more selected from the group consisting of a bisphenol F-type epoxy resin, a phenol-novolak-type epoxy resin, a cresol-novolak-type epoxy resin, a naphthalene-type epoxy resin, an anthracene-type epoxy resin, a biphenyl-type epoxy resin, a biphenylaralkyl-type epoxy resin, and a dicyclopentadiene-type epoxy resin.

10. The method for producing a thermosetting resin composition according to claim 1, wherein (F) a curing agent is mixed with (A) the maleimide compound, (B) the epoxy resin having at least two epoxy groups in one molecule, (C) the copolymer resin having a structural unit derived from an aromatic vinyl compound and a structural unit derived from a maleic anhydride, (D) the silica treated with an aminosilane coupling agent, and (E) the flame retardant dispersion.

11. A method for producing a prepreg comprising impregnating or applying the thermosetting resin composition produced by the method of claim 1 to a sheet-like reinforcing substrate.

12. A method for producing a laminate comprising laminating the prepreg produced by the method of claim 11 and a metal foil.

13. A method for producing a printed wiring board comprising forming electric circuits on the prepreg produced by the method of claim 11.

14. The method for producing a thermosetting resin composition according to claim 1, wherein the flame retardant has a mean particle size of 0.5 to 6 μm.

15. The method for producing a thermosetting resin composition according to claim 1, wherein the flame retardant has a mean particle size of 1 to 5 μm.

* * * * *